United States Patent
Ha et al.

(10) Patent No.: US 10,978,453 B2
(45) Date of Patent: Apr. 13, 2021

(54) INTEGRATED CIRCUIT DEVICES AND METHODS OF FABRICATING SUCH DEVICES

(71) Applicant: Samsung Electronics Co., Ltd., Suwon-si (KR)

(72) Inventors: Dae-Won Ha, Seoul (KR); Byoung-Hak Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 62 days.

(21) Appl. No.: 16/205,481

(22) Filed: Nov. 30, 2018

(65) Prior Publication Data

US 2019/0109137 A1 Apr. 11, 2019

Related U.S. Application Data

(63) Continuation of application No. 15/434,177, filed on Feb. 16, 2017, now Pat. No. 10,177,148.

(30) Foreign Application Priority Data

Aug. 3, 2016 (KR) .................. 10-2016-0099061

(51) Int. Cl.
*H01L 27/092* (2006.01)
*H01L 21/84* (2006.01)
(Continued)

(52) U.S. Cl.
CPC .... *H01L 27/0924* (2013.01); *H01L 21/02192* (2013.01); *H01L 21/266* (2013.01);
(Continued)

(58) Field of Classification Search
CPC .......... H01L 21/845; H01L 21/823821; H01L 27/0886; H01L 27/0924; H01L 27/10826;
(Continued)

(56) References Cited

U.S. PATENT DOCUMENTS 4,700,316 A 10/1987 Nair
7,681,164 B2 3/2010 Lin et al.
(Continued)

FOREIGN PATENT DOCUMENTS

KR 10-2015-0118878 10/2015
KR 10-2016-0047380 5/2016

OTHER PUBLICATIONS

Gavartin, J.L., et al. "The Role of Nitrogen-Related Defects in High-K Dielectric Oxides: Density-Functional Studies," AIP Journal of Applied Physics 97, 053704 (2005).
(Continued)

*Primary Examiner* — Thanhha S Pham
(74) *Attorney, Agent, or Firm* — Myers Bigel, P.A

(57) ABSTRACT

An integrated circuit device includes: a plurality of channel regions spaced apart from each other in an active region; a plurality of source/drain regions; an insulating structure on the active region, the insulating structure defining a plurality of gate spaces; a first gate stack structure in a first of the gate spaces, the first gate stack structure including a first work function metal-containing layer; and an isolation stack structure in a second of the gate spaces that is adjacent the first of the gate spaces, the isolation stack structure having a different stack structure from the first gate stack structure and being configured to electrically isolate a portion of the active region.

16 Claims, 28 Drawing Sheets

(51) Int. Cl.

| | | |
|---|---|---|
| *H01L 29/66* | (2006.01) | |
| *H01L 29/78* | (2006.01) | |
| *H01L 21/8234* | (2006.01) | |
| *H01L 21/8238* | (2006.01) | |
| *H01L 27/088* | (2006.01) | |
| *H01L 29/165* | (2006.01) | |
| *H01L 21/02* | (2006.01) | |
| *H01L 21/266* | (2006.01) | |
| *H01L 29/06* | (2006.01) | |
| *H01L 29/49* | (2006.01) | |
| *H01L 29/51* | (2006.01) | |

(52) U.S. Cl.
CPC ........... *H01L 21/823431* (2013.01); *H01L 21/823437* (2013.01); *H01L 21/823481* (2013.01); *H01L 21/823821* (2013.01); *H01L 21/823828* (2013.01); *H01L 21/823878* (2013.01); *H01L 21/845* (2013.01); *H01L 27/0886* (2013.01); *H01L 29/0642* (2013.01); *H01L 29/0649* (2013.01); *H01L 29/165* (2013.01); *H01L 29/4966* (2013.01); *H01L 29/66545* (2013.01); *H01L 29/66818* (2013.01); *H01L 29/7846* (2013.01); *H01L 29/7854* (2013.01); *H01L 29/513* (2013.01); *H01L 29/517* (2013.01)

(58) Field of Classification Search
CPC ........... H01L 27/10879; H01L 27/1211; H01L 29/41791; H01L 29/66795; H01L 29/785; H01L 21/823481; H01L 21/823878; H01L 21/823431; H01L 21/823437; H01L 29/7845; H01L 27/085; H01L 27/088
See application file for complete search history.

(56) References Cited

U.S. PATENT DOCUMENTS

| | | |
|---|---|---|
| 9,209,179 B2 | 12/2015 | Lee et al. |
| 9,263,516 B1 | 2/2016 | Wu et al. |
| 9,941,290 B2 * | 4/2018 | Hsieh ............... H01L 27/11273 |
| 2014/0264609 A1 | 9/2014 | Fung |
| 2016/0071848 A1 | 3/2016 | Sengupta et al. |
| 2016/0093511 A1 | 3/2016 | Sengupta et al. |
| 2016/0110489 A1 | 4/2016 | Schroeder et al. |
| 2017/0352670 A1 | 12/2017 | Hsieh |

OTHER PUBLICATIONS

Velosa A., et al. "Gate-Last vs. Gate-First Technology for Aggressively Sealed EOT Logic/RF CMOS," IEEE, 2011 Symposium on VLSI Technology Digest of Technical Papers, 978-4-86348-164-0, pp. 34-35.

Velosa A., et al. "Process Control & Integration Options of RMG Technology for Aggressively Sealed Devices," IEEE, 2012 Symposium on VLSI Technology Digest of Technical Papers, 978-1-4673-0847-2, p. 33-34.

Lee, Byoung Hun et al., "Gate Stack Technology for Nanoscale Devices," Materials Today, Jun. 2006, vol. 9, No. 6, pp. 32-40.

Yu, H.Y. et al., "Fermi Pinning-Induced Thermal Instability of Metal-Gate Work Functions," IEEE Electron Device Letters, vol. 25, No. 5, May 2004, pp. 337-339.

Watane, Takeshi et al., "Impact of Hf Concentration on Performance and Reliability for HfSiON-CMOSFET," IEEE, 0-7803-8684-1, (2004).

Togo, M. et al., "Novel N/PFET Vt Control by TiN Plasma Nitridation for Aggressive Gate Scaling," IEEE, 2016 Symposium on VLSI Technology Digest of Technical Papers, 2016, pp. 206-207.

Freeouf, J. L., et al. "Schottky Barriers: An Effective Work Function Model," Appl. Phys. Lett., 39: 727-729.

Ragnarsson, L.A., et al., "Zero-Thickness Multi Work Function Solutions for N7 Bulk FinFETs," IEEE, 2016 Symposium on VLSI Technology Digest of Technical Papers, pp. 98-99.

X. P. Wang, et al., "Dual Metal Gates With Band-Edge Work Functions no Novel HfLaO High-? Gate Dielectric," IEEE, 2006 Symposium on VLSI Technology Digest of Technical Papers, 2006.

Hyung-Suk Jung, et al. Integration Friendly Dual Metal Gate Technology Using Dual Thickness Metal Inserted Poly-Si Stacks (DT-MIPS), IEEE 2007 Symposium on VLSI Technology Digest of Technical Papers, 2007, pp. 196-197.

Ming-Fu Li, "Novel Hafnium-Based Compound Metal Oxide Gate Dielectrics for Advanced CMOS Technology," http://me.fudan.edu.cn/faculty/personweb/limingfu/papers%20in%20web/technology/[2]%205.17%20GSTP07%20Keynote%20second%20revisionl.pdf.

* cited by examiner

INTEGRATED CIRCUIT DEVICES AND METHODS OF FABRICATING SUCH DEVICES

CROSS-REFERENCE TO RELATED APPLICATION

The present application is a continuation application of and claims priority from U.S. patent application Ser. No. 15/434,177, filed on Feb. 16, 2017, which claims priority under 35 U.S.C. § 119 of Korean Patent Application No. 10-2016-0099061, filed on Aug. 3, 2016, in the Korean Intellectual Property Office, the disclosures of both are incorporated herein in their entirety by reference.

BACKGROUND

The inventive concept relates to integrated circuit devices and to methods of fabricating such devices and, more particularly, to integrated circuit devices that include field effect transistors and to methods of fabricating the same.

With the continued development of electronic technology, semiconductor devices are becoming more highly integrated and the sizes of the individual circuit elements included therein are being reduced. Thus, there is a need to reduce the size of an isolation region between adjacent transistors to facilitate increased integration density.

SUMMARY

The inventive concept provides an integrated circuit device having a structure, which allows an isolation region between adjacent transistors to have a reduced area while allowing desired performance to be realized.

The inventive concept also provides a method of fabricating an integrated circuit device, the method being capable of providing an isolation region for insulating adjacent transistors using simplified processes.

According to an aspect of the inventive concept, there is provided an integrated circuit device includes: a fin-type active region extending in a first direction on a substrate; a plurality of conductive stack structures extending parallel to each other along a second direction that intersects the first direction; and a plurality of source/drain regions on the fin-type active region, wherein the plurality of conductive stack structures include: a gate stack structure including a first conductive metal nitride layer and having a first effective work function; and an isolation stack structure, which is adjacent the gate stack structure, includes a second conductive metal nitride layer, and has a second effective work function that is different from the first effective work function, the second conductive metal nitride layer including the same metal nitride as a metal nitride included in the first conductive metal nitride layer and having a different thickness than the first conductive metal nitride layer.

According to another aspect of the inventive concept, there is provided an integrated circuit device includes: an active region on a substrate; a plurality of channel regions spaced apart from each other in the active region; a plurality of source/drain regions on the substrate; an insulating structure on the active region, the insulating structure defining a plurality of gate spaces; a first gate stack structure in a first of the gate spaces, the first gate stack structure including a first work function metal-containing layer; and an isolation stack structure in a second of the gate spaces that is adjacent the first of the gate spaces, the isolation stack structure having a different stack structure from the first gate stack structure and being configured to electrically isolate a portion of the active region.

According to a further aspect of the inventive concept, there is provided an integrated circuit device comprising an active region on a substrate; a first channel region and a second channel region spaced apart from each other in the active region; a first gate stack structure extending over the first channel region; a second gate stack structure extending over the second channel region; an isolation stack structure positioned between the first gate stack structure and the second gate stack structure, the isolation stack structure having a different effective work function than the first gate stack structure and the second gate stack structure, wherein the isolation stack structure is configured to function as an isolation region during normal operation of a first transistor that includes first gate stack structure and a second transistor that includes second gate stack structure.

According to a further aspect of the inventive concept, there is provided a method of fabricating an integrated circuit device, the method including: forming an insulating structure on an active region, the insulating structure defining a plurality of gate spaces; forming a gate stack structure in a first of the gate spaces, the gate stack structure including a first conductive metal nitride layer and having a first effective work function; and forming an isolation stack structure in a second of the gate spaces that is adjacent the first of the gate spaces, the isolation stack structure including a second conductive metal nitride layer and having a second effective work function that is different from the first effective work function, the second conductive metal nitride layer including the same metal nitride as a metal nitride included in the first conductive metal nitride layer and having a different thickness from the first conductive metal nitride layer.

According to the inventive concept, the integrated circuit device allows the isolation region for stable insulation to have a reduced area, thereby exhibiting desired performance within a small area.

In addition, according to the method of fabricating the integrated circuit device, according to the inventive concept, a stable isolation region may be provided simultaneously with a process of forming a gate of a transistor without the need for addition of separate cumbersome processes to provide the isolation region for partially insulating the active region. Therefore, processes of fabricating the integrated circuit device can be simplified, and the design of arrangement of the isolation region for effective insulation can be facilitated.

BRIEF DESCRIPTION OF THE DRAWINGS

Embodiments of the inventive concept will be more clearly understood from the following detailed description taken in conjunction with the accompanying drawings in which:

FIGS. 15A to 18B are cross-sectional views illustrating a method of fabricating an integrated circuit device according to embodiments of the inventive concepts and, in particular, FIGS. 15A, 16A, 17A, and 18A are cross-sectional views which are taken along a portion of the line 2-2' of FIG. 1, and FIGS. 15B, 16B, 17B, and 18B are cross-sectional views which are taken along respective portions of lines 3A-3A' and 3B-3B' of FIG. 1;

DETAILED DESCRIPTION

Figure 1:
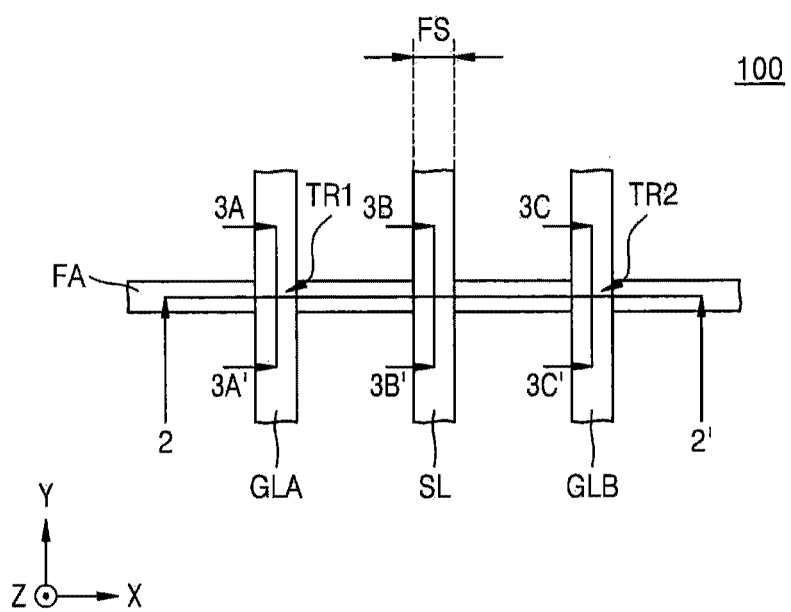
FIG. 1 is a planar layout diagram illustrating a main configuration of an integrated circuit device according to embodiments of the inventive concepts.

Hereinafter, certain embodiments of the inventive concept will be described with reference to the accompanying drawings. Like components will be denoted by like reference numerals throughout the specification, and repeated descriptions thereof will be omitted.

Figure 2:
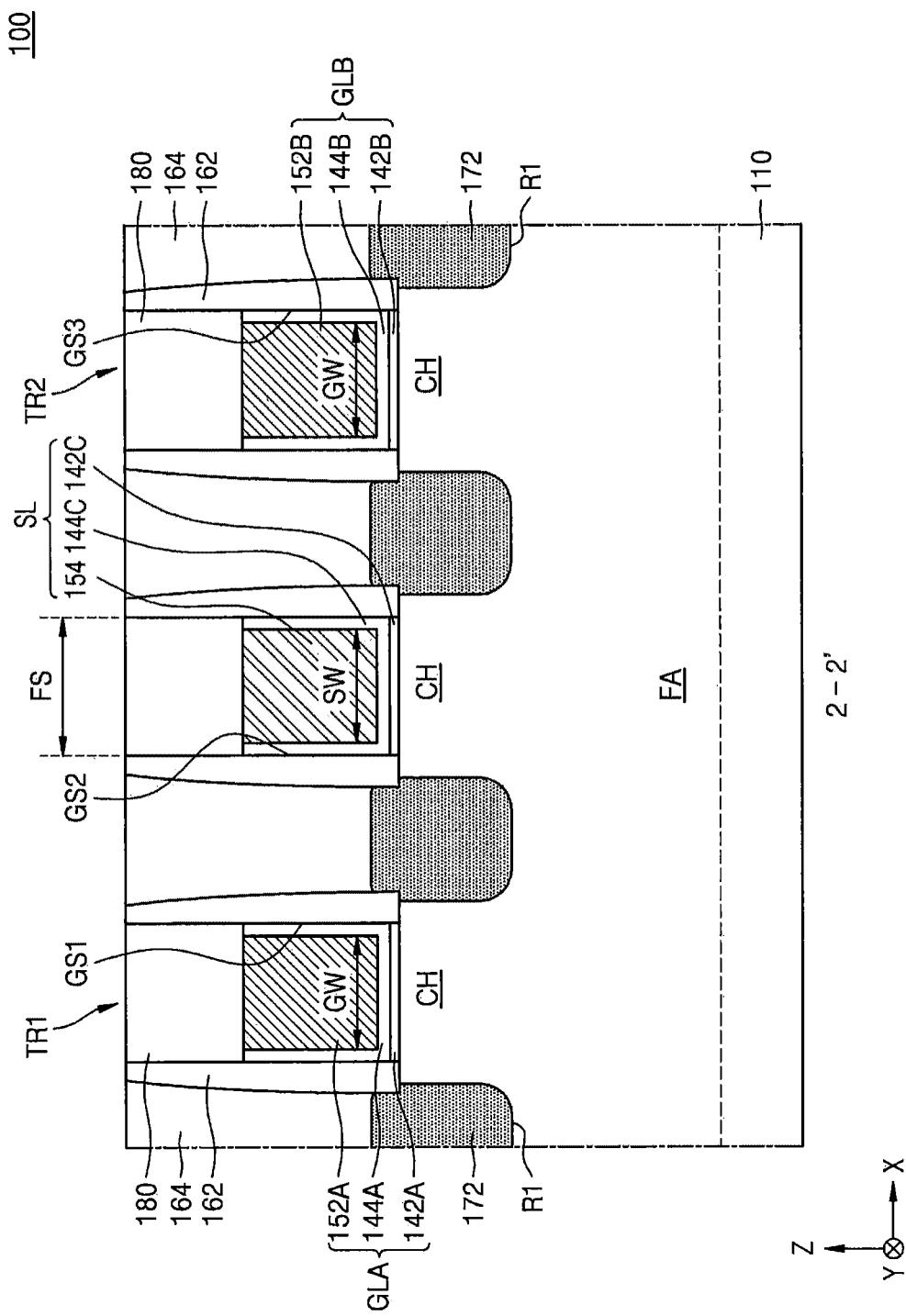
FIG. 2 is a cross-sectional view taken along line 2-2' of FIG. 1.
Figure 3:
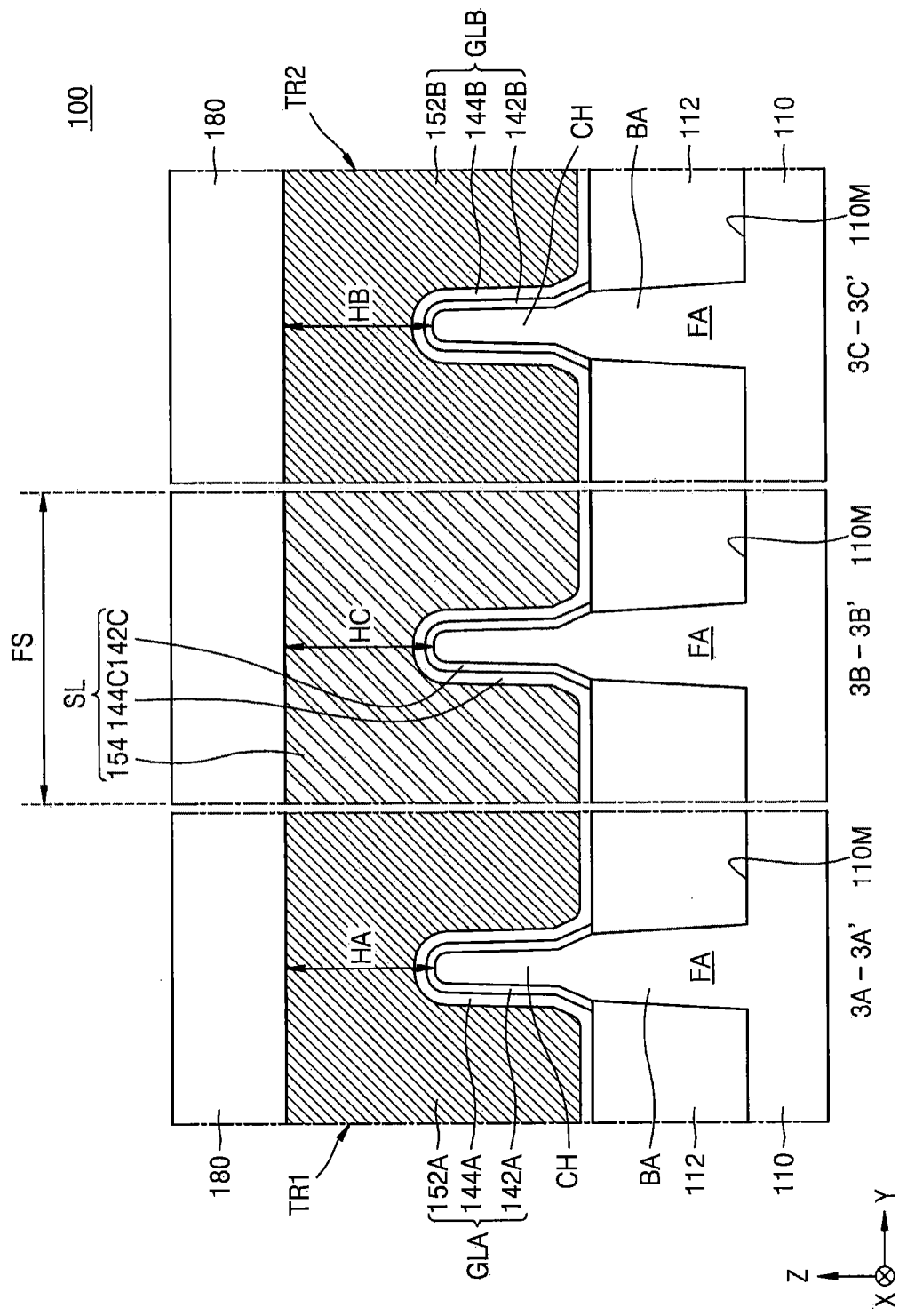
FIG. 3 is a series of cross-sectional views taken along lines 3A-3A', 3B-3B', and 3C-3C', respectively, of FIG. 1.

FIG. 1 is a planar layout diagram illustrating an integrated circuit device 100 according to certain embodiments of the inventive concepts. FIG. 2 is a cross-sectional view taken along line 2-2' of FIG. 1. FIG. 3 is a series of cross-sectional views taken along lines 3A-3A', 3B-3B', and 3C-3C', respectively, of FIG. 1.

Referring to FIGS. 1 to 3, the integrated circuit device 100 includes: a fin-type active region FA extending in a first direction (X direction); a plurality of channel regions CH in the fin-type active region FA, the channel regions CH being spaced apart from each other along the first direction; and a plurality of source/drain regions 172, where a source/drain region 172 is provided on either side of each of the channel regions CH. Insulating spacers 162 are formed on the channel regions CH in the fin-type active region FA and define a plurality of gate spaces GS1, GS2, and GS3. An inter-gate dielectric 164 covers the source/drain regions 172. The insulating spacers 162 and the inter-gate dielectric 164 may constitute an insulating structure defining the plurality of gate spaces GS1, GS2, and GS3.

The gate spaces GS1, GS2, and GS3 may extend in a second direction (Y direction) that intersects the first direction. The number of gate spaces GS1, GS2, and GS3 may equal the number of channel regions CH. A first gate stack structure GLA is formed in the first gate space GS1, and an isolation stack structure SL is formed in the second gate space GS2 that is adjacent the first gate space GS1. A second gate stack structure GLB is formed in the third gate space GS3. The third gate space GS3 is adjacent the second gate space GS2 and positioned opposite the first gate space GS1.

An insulating capping layer 180 is formed in the plurality of gate spaces GS1, GS2, and GS3 that covers top surfaces of the first and second gate stack structures GLA and GLB and a top surface of the isolation stack structure SL.

The first and second gate stack structures GLA and GLB may have the same structure. The isolation stack structure SL may have a stack structure that is different than the first and second gate stack structures GLA and GLB. The isolation stack structure SL may electrically isolate portions of the fin-type active region FA on opposed sides of the isolation stack structure SL from each other. A width of a fin isolation region FS may be determined by a width of the isolation stack structure SL.

First and second transistors TR1 and TR2 may be respectively formed at points at which the fin-type active region FA intersects the first and second gate stack structures GLA and GLB.

In some embodiments, an area of a substrate 110, which is shown in FIGS. 1 to 3, may be a logic area in which a logic device is formed, or a memory area in which a memory device is formed. The logic area may include various logic cells including a plurality of circuit elements, such as a transistor, a register, and the like, as standard cells performing desired logic functions, such as a counter, a buffer, and the like. The memory area may include, for example, an SRAM, DRAM, MRAM, RRAM, or PRAM area.

In one example, the portion of the substrate 110 that is shown in FIGS. 1 to 3 may be an NMOS transistor area, and N-type channels may be formed in the channel regions CH. In another example, the portion of the substrate 110 that is shown in FIGS. 1 to 3 may be a PMOS transistor area, and P-type channels may be formed in the channel regions CH. In some embodiments, the portion of the substrate 110 which is shown in FIGS. 1 to 3 may be a high voltage NMOS or PMOS transistor area to which a relatively high operating voltage is applied. In other embodiments, the portion of the substrate 110 which is shown in FIGS. 1 to 3 may be a low voltage NMOS or PMOS transistor area to which a relatively low operating voltage is applied. Here, a high voltage transistor may refer to a transistor having an operating voltage of 1 V or more, and a low voltage transistor may refer to a transistor having an operating voltage that is less than 1 V.

As shown in FIGS. 1 to 3, the first and second gate stack structures GLA and GLB and the isolation stack structure SL therebetween may be arranged at regular pitches (i.e., any two adjacent stack structures are separated by a same distance) and extend parallel to each other. In some embodiments, a width GW of each of the first and second gate stack structures GLA and GLB in the first direction (X direction) may be equal to a width SW of the isolation stack structure SL. Heights HA, HB, and HC of the first and second gate stack structures GLA and GLB and the isolation stack structure SL may be equal to each other in some embodiments.

Although one first gate stack structure GLA and one second gate stack structure GLB are shown as being respectively arranged on opposed sides of the isolation stack structure SL in FIGS. 1 to 3, the inventive concept is not limited thereto. In some embodiments, a plurality of first gate stack structures GLA or a plurality of second gate stack structures GLB may be arranged on the fin-type active region FA on at least one side of the isolation stack structure SL. In other embodiments, a plurality of isolation stack structures SL may extend parallel to each other along the second direction (Y direction) on the fin-type active region FA, and at least one first gate stack structure GLA or at least one second gate stack structure GLB may be arranged between every two of the plurality of isolation stack structures SL. The above-described structures may also be repeated in any of the first direction (X direction), the second direction (Y direction) and/or in a third direction (Z direction) that is perpendicular to the first and second directions to form larger devices.

The fin-type active region FA protrudes from the substrate 110 in the third direction (Z direction). The third direction (Z direction) may be perpendicular to a main plane 110M of the substrate 110. The fin-type active region FA includes a base region BA having sidewalls that are covered with a device isolation layer 112, and channel regions CH that extend upwards (i.e., in the Z direction) from respective portions of the base region BA. The channel regions CH may extend upwardly above top surfaces of the device isolation layer 112.

Each of the gate stack structures GLA and GLB and the isolation stack structure SL have a respective one of the channel regions CH associated therewith. The first gate stack structure GLA includes a first interfacial layer 142A covering the channel region CH of the fin-type active region FA that is associated with the first gate stack structure GLA. A first gate insulating layer 144A and a first conductive stack structure 152A are stacked on the first interfacial layer 142A and cover a top surface and both sidewalls of the channel region CH of the fin-type active region FA that is associated with the first gate stack structure GLA. The second gate stack structure GLB includes a second interfacial layer 142B covering the channel region CH of the fin-type active region FA that is associated with the second gate stack structure GLB, and a second gate insulating layer 144B and a second conductive stack structure 152B, which are stacked on the second interfacial layer 142B and cover the top surface and both sidewalls of the channel region CH of the fin-type active region FA that is associated with the second gate stack structure GLB.

The isolation stack structure SL in the fin isolation region FS includes a third interfacial layer 142C covering the channel region CH of the fin-type active region FA that is associated with the isolation stack structure SL. A third gate insulating layer 144C and an isolation conductive stack structure 154 are stacked on the third interfacial layer 142C and cover the top surface and both sidewalls of the channel regions CH of the fin-type active region FA that is associated with the isolation stack structure SL.

The first and second conductive stack structures 152A and 152B may constitute normal gates having structures allowing the respective first and second transistors TR1 and TR2 to operate normally. The first and second gate stack structures GLA and GLB may have respective effective work functions for achieving target threshold voltages used in the normal operation of the respective first and second transistors TR1 and TR2. The first and second gate stack structures GLA and GLB may have the same structure as each other.

On the other hand, the isolation stack structure SL in the fin isolation region FS may have an effective work function that is different from the effective work functions of the first and second gate stack structures GLA and GLB. To accomplish this, the isolation conductive stack structure 154 may have a stack structure that is different from the stack structures of the first and second gate stack structures GLA and GLB.

In one example, when each of the first and second transistors TR1 and TR2 is an NMOS transistor and the first and second gate stack structures GLA and GLB have effective work functions within a range of about 4.1 eV to about 4.5 eV, the isolation stack structure SL may have an effective work function of about 4.8 eV or more. In another example, when each of the first and second transistors TR1 and TR2 is a PMOS transistor and the first and second gate stack structures GLA and GLB have effective work functions within a range of about 4.8 eV to about 5.2 eV, the isolation stack structure SL may have an effective work function of about 4.5 eV or less. Thus, a transistor having the isolation stack structure SL as a gate may constitute an abnormal transistor having a threshold voltage that is higher than the threshold voltages required for the operation of the first and second transistors TR1 and TR2. Therefore, when the first and second transistors TR1 and TR2 are turned on, the abnormal transistor having the isolation stack structure SL as a gate may not be turned on and may not operate as a transistor.

Each of the first and second conductive stack structures 152A and 152B and the isolation conductive stack structure 154 may include a work function metal-containing layer. However, the work function metal-containing layers included in the first and second gate stack structures GLA and GLB may have different materials and/or thicknesses from those of the work function metal-containing layer included in the isolation stack structure SL. In addition, each of the first and second conductive stack structures 152A and 152B and the isolation conductive stack structure 154 may include a gap-fill metal-containing layer that fills a space above the work function metal-containing layer. The work function metal-containing layer may include at least one metal selected from among Ti, W, Ru, Nb, Mo, Hf, Ni, Co, Pt, Yb, Tb, Dy, Er, and Pd. The gap-fill metal-containing layer may include a W layer or an Al layer in some embodiments. In some embodiments, each of the first and second conductive stack structures 152A and 152B and the isolation conductive stack structure 154 may include a stack structure of TiAlC/TiN/W, a stack structure of TiN/TaN/TiAlC/TiN/W, or a stack structure of TiN/TaN/TiN/TiAlC/TiN/W, but the inventive concept is not limited thereto.

Embodiments of the inventive concepts having various designs for the first and second gate stack structures GLA and GLB and the isolation stack structure SL will be described below in more detail with reference to FIGS. 4 to 14.

The substrate 110 may include a semiconductor such as Si or Ge, or a compound semiconductor such as SiGe, SiC, GaAs, InAs, or InP. The substrate 110 may include a conductive region, for example, an impurity-doped well, or an impurity-doped structure. The fin-type active region FA may be formed by etching a portion of the substrate 110, and may include the same material as the substrate 110.

The device isolation layer 112 may include an oxide layer, a nitride layer, or combinations thereof. In some embodiments, the device isolation layer 112 may include an insulating liner (not shown) for applying stress to the channel regions CH, and a gap-fill insulating layer (not shown) covering the insulating liner. Stress is applied to the channel regions CH by the insulating liner, thereby improving carrier mobility in the channel regions CH. For example, when N-type channels are formed in the channel regions CH, an insulating liner for applying tensile stress may be formed on a sidewall of the fin-type active region FA. When P-type channels are formed in the channel regions CH, an insulating liner for applying compressive stress may be formed on the sidewall of the fin-type active region FA. The insulating liner for applying tensile or compressive stress may include SiN, SiON, SiBN, SiC, SiC:H, SiCN, SiCN:H, SiOCN, SiOCN:H, SiOC, $SiO_2$, polysilicon, or combinations thereof. The gap-fill insulating layer may include an oxide layer. For example, the gap-fill insulating layer may include fluoride silicate glass (FSG), undoped silicate glass (USG), borophosphosilicate glass (BPSG), phosphosilicate glass (PSG), flowable oxide (FOX), plasma enhanced tetraethylorthosilicate (PE-TEOS), or tonen silazene (TOSZ), without being limited thereto.

The first to third interfacial layers 142A, 142B, and 142C may include low-K dielectric material layers having dielectric constants of about 9 or less, for example, silicon oxide layers, silicon oxynitride layers, Ga oxide layers, Ge oxide layers, or combinations thereof. In some other embodiments, the first to third interfacial layers 142A, 142B, and 142C may include silicates, combinations of silicates and silicon oxide layers, or combinations of silicates and silicon oxynitride layers. In some embodiments, the first to third interfacial layers 142A, 142B, and 142C may have thicknesses of about 5 Å to about 20 Å, without being limited thereto. In some embodiments, each of the first to third interfacial layers 142A, 142B, and 142C may have the same composition. In some embodiments, at least one of the first to third interfacial layers 142A, 142B, and 142C may be omitted.

In some embodiments, each of the first to third gate insulating layers 144A, 144B, and 144C may include a silicon oxide layer, a high-K dielectric layer, or combinations thereof. The high-K dielectric layer may include a material having a dielectric constant that is greater than a dielectric constant of a silicon oxide layer. For example, the first to third gate insulating layers 144A, 144B, and 144C may have dielectric constants of about 10 to about 25. The high-K dielectric layer may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, without being limited thereto. The first to third gate insulating layers 144A, 144B, and 144C may have the same stack structure as each other, or may have different stack structures from each other.

The source/drain regions 172 may be formed on the fin-type active region FA on both sides of the first and second gate stack structures GLA and GLB and on both sides of the isolation stack structure SL. The source/drain regions 172 may include impurity-ion-implanted regions in portions of the fin-type active region FA, semiconductor epitaxial patterns that are epitaxially grown on a plurality of recess regions R1 in the fin-type active region FA, or combinations thereof. Each of the source/drain regions 172 may include, for example, an epitaxially grown Si layer, an epitaxially grown SiC layer, or a plurality of epitaxially grown SiGe layers. When the first and second transistors TR1 and TR2 are NMOS transistors, the source/drain regions 172 may include epitaxially grown Si layers or epitaxially grown SiC layers, and may include N-type impurities. When the first and second transistors TR1 and TR2 are PMOS transistors, the source/drain regions 172 may include epitaxially grown SiGe layers, and may include P-type impurities.

The insulating spacers 162 may include silicon nitride layers, SiOCN layers, SiCN layers, or combinations thereof. The inter-gate dielectric 164 may include a silicon oxide layer. The insulating capping layer 180 may include a silicon nitride layer, a SiOCN layer, a SiCN layer, or combinations thereof.

FIGS. 4 to 14 are cross-sectional views illustrating exemplary structures of integrated circuit devices 100A, 100B, 100C, 100D, 100E, 100F, 100G, 100H, 100I, 100J, and 100K according to certain embodiments of the inventive concepts that have various designs for the gate stack structures GLA and GLB and for the isolation stack structure SL of the integrated circuit device 100 of FIG. 1-3. In FIGS. 4 to 14, the same reference numerals as in FIGS. 1 to 3 denote the same structures, and descriptions thereof will be omitted.

Gate stack structures GL1, GL2, and GL3, each of which constitutes the first transistor TR1, and isolation stack structures SL1, SL2, SL3, SL4, SL5, SL6, SL7, SL8, and SL9, each of which constitutes the fin isolation region FS, will be mainly described with reference to FIGS. 4 to 14. FIGS. 4 to 14 show only the design of the first transistor TR1 and the isolation stack structure SL of the integrated circuit devices according to the embodiments of the inventive concepts for convenience. It will be appreciated that each of the integrated circuit devices shown in FIGS. 4 to 14 may further include the second transistor TR2 shown in FIGS. 1 to 3, and the second transistor TR2 may have substantially the same configuration as the first transistor TR1 in each of the embodiments shown in FIGS. 4 to 14.

Figure 4:
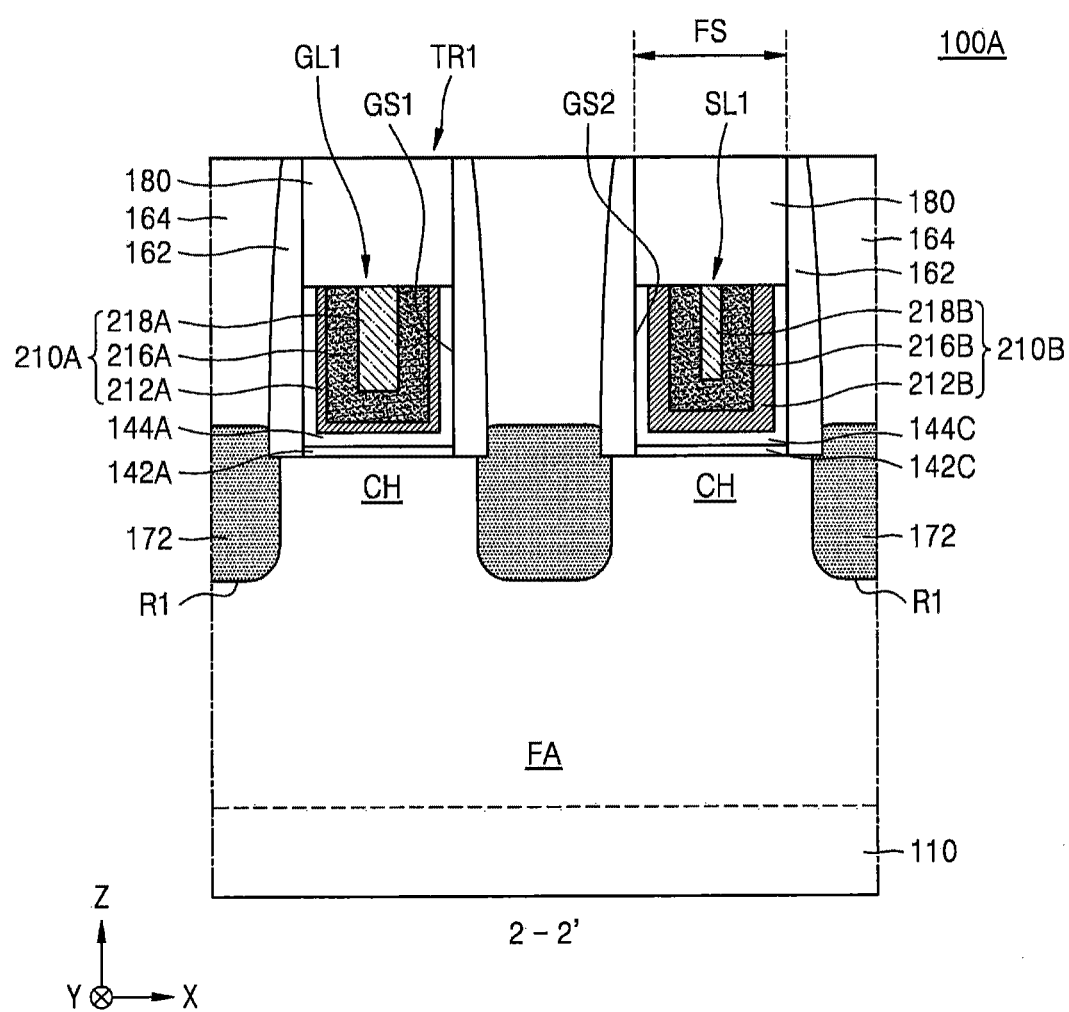
FIGS. 4 to 14 are cross-sectional views illustrating the gate stack structures and isolation stack structures of integrated circuit devices according to various embodiments of the inventive concepts.

Referring to FIG. 4, in the integrated circuit device 100A, the gate stack structure GL1 of the first transistor TR1 includes a conductive stack structure 210A. The conductive stack structure 210A includes a first work function metal-containing layer 212A, which covers the first gate insulating layer 144A. The isolation stack structure SL1 constituting the fin isolation region FS includes a conductive stack structure 210B. The conductive stack structure 210B includes a second work function metal-containing layer 212B, which covers the third gate insulating layer 144C. The second work function metal-containing layer 212B may include the same material as the first work function metal-containing layer 212A. The first work function metal-containing layer 212A and the second work function metal-containing layer 212B may have different thicknesses from each other.

When each of the source/drain regions 172 includes N-type impurities and the first transistor TR1 is an NMOS transistor, a thickness of the second work function metal-containing layer 212B may be greater than a thickness of the first work function metal-containing layer 212A.

In some embodiments, the first and second work function metal-containing layers 212A and 212B may be PMOS work function metal-containing layers including metal nitrides. For example, the first and second work function metal-containing layers 212A and 212B may include TiN, TaN, or combinations thereof.

The gate stack structure GL1 may further include a third work function metal-containing layer 216A and a first gap-fill metal-containing layer 218A, which cover the first work function metal-containing layer 212A in this stated order. The isolation stack structure SL1 may further include a fourth work function metal-containing layer 216B and a second gap-fill metal-containing layer 218B, which cover the second work function metal-containing layer 212B in this stated order.

The third and fourth work function metal-containing layers 216A and 216B may include the same material as each other, and may have the same thickness as each other. The third and fourth work function metal-containing layers 216A and 216B may be NMOS work function adjusting metal-containing layers. For example, the third and fourth work function metal-containing layers 216A and 216B may include TiAlC, TiAlN, or combinations thereof.

The first gap-fill metal-containing layer 218A may fill a space remaining above the third work function metal-containing layer 216A in the gate space GS1. The second gap-fill metal-containing layer 218B may fill a space remaining above the fourth work function metal-containing layer 216B in the gate space GS2. In the gate spaces GS1 and GS2 having the same width and height, the thickness of the second work function metal-containing layer 212B included in the isolation stack structure SL1 is greater than the thickness of the first work function metal-containing layer 212A included in the gate stack structure GL1, and consequently the thickness of the second gap-fill metal-containing layer 218B may be less than the thickness of the first gap-fill metal-containing layer 218A. The first and second gap-fill metal-containing layers 218A and 218B may include, for example, W, Al, or combinations thereof.

In the integrated circuit device 100A shown in FIG. 4, the gate stack structure GL1 may have a certain effective work function so that the first transistor TR1 will have a target threshold voltage required for the normal operation of an NMOS transistor, for example, an effective work function selected from a range of about 4.1 eV to about 4.5 eV. A transistor including the isolation stack structure SL1 may have a threshold voltage that is higher than the target threshold voltage required for normal operation of an NMOS transistor, and to this end, the isolation stack structure SL1 may have an effective work function that is higher than the effective work function of the gate stack structure GL1. For example, the isolation stack structure SL1 may have an effective work function of about 4.8 eV or more, without being limited thereto. Since the isolation stack structure SL1 has a higher effective work function than the gate stack structure GL1, the transistor including the isolation stack structure SL1 does not operate and may function as an isolation region in the fin-type active region FA when the first transistor TR1 operates normally as an NMOS transistor.

Figure 5:
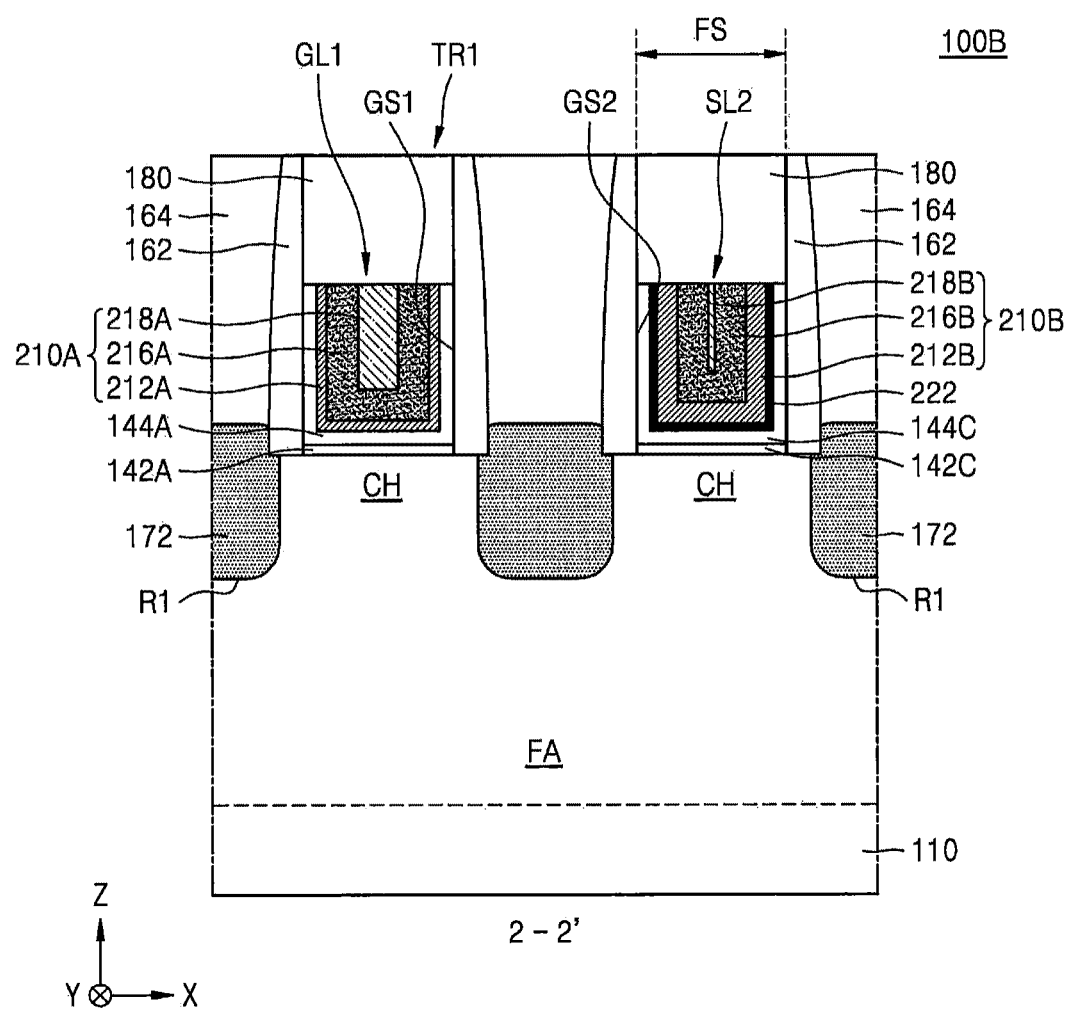

Referring to FIG. 5, the integrated circuit device 100B has mostly the same configuration as the integrated circuit device 100A shown in FIG. 4. However, in the integrated circuit device 100B, the isolation stack structure SL2, unlike the isolation stack structure SL1 shown in FIG. 4, may further include a La-containing layer 222 between the third gate insulating layer 144C and the second work function metal-containing layer 212B. The La-containing layer 222 may include a $La_2O_3$ layer, without being limited ther In the integrated circuit device 100B, a transistor including the isolation stack structure SL2 includes the La-containing layer 222 and thus may have a higher threshold voltage than the transistor including the isolation stack structure SL1 shown in FIG. 4. Thus, when the first transistor TR1 operates normally as an NMOS transistor, the transistor including the isolation stack structure SL2 does not operate and may function as an isolation region in the fin-type active region FA.

Figure 6:
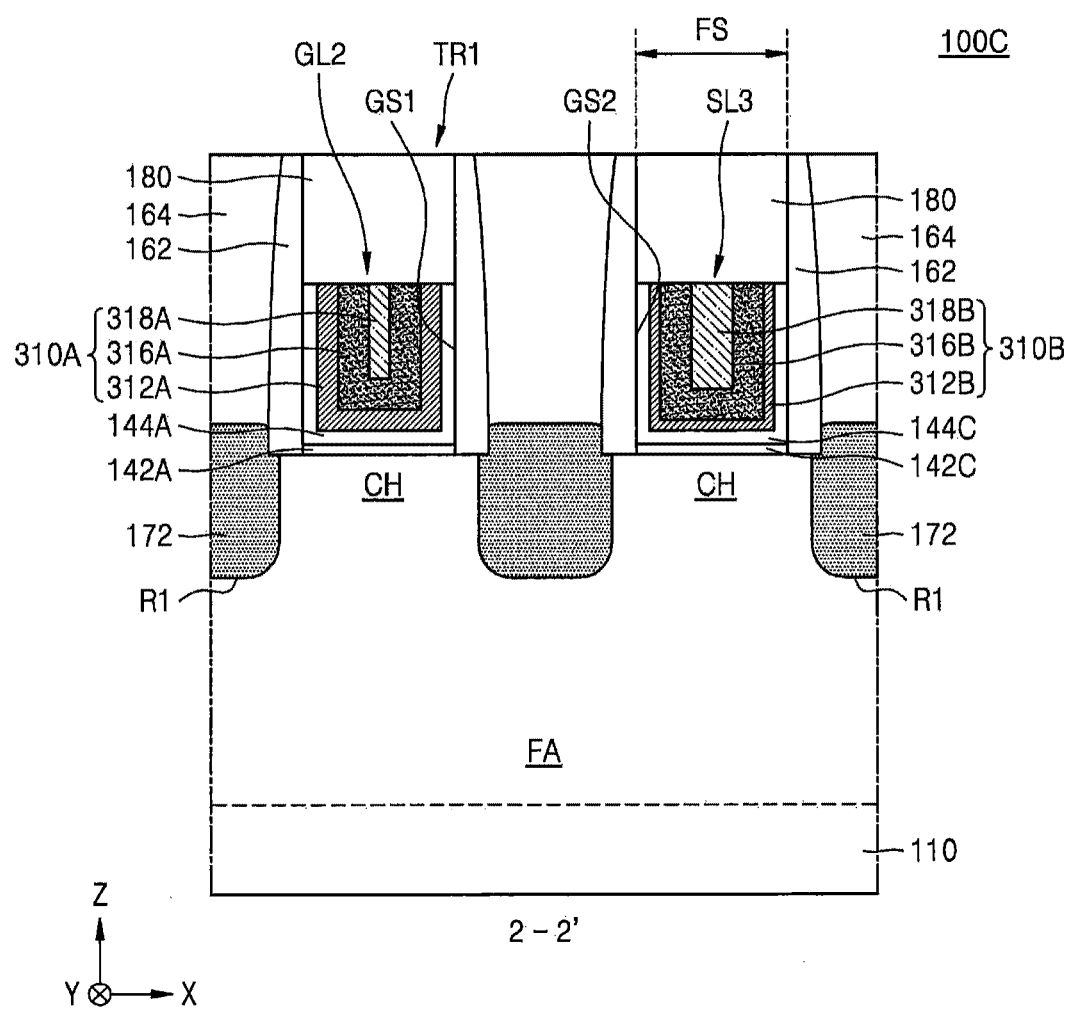

In the integrated circuit device 100C of FIG. 6, the gate stack structure GL2 constituting the first transistor TR1 includes a conductive stack structure 310A. The conductive stack structure 310A includes a first work function metal-containing layer 312A, which covers the first gate insulating layer 144A. The isolation stack structure SL3 constituting the fin isolation region FS includes a conductive stack structure 310B. The conductive stack structure 310B includes a second work function metal-containing layer 312B, which covers the third gate insulating layer 144C. The second work function metal-containing layer 312B includes the same material as the first work function metal-containing layer 312A, and has a thickness that is smaller than a thickness of the first work function metal-containing layer 312A. Here, each of the source/drain regions 172 may include P-type impurities, and the first transistor TR1 may be a PMOS transistor.

In some embodiments, the first and second work function metal-containing layers 312A and 312B may be PMOS work function adjusting metal-containing layers including metal nitrides. For example, the first and second work function metal-containing layers 312A and 312B may include TiN, TaN, or combinations thereof.

The gate stack structure GL2 may further include a third work function metal-containing layer 316A and a first gap-fill metal-containing layer 318A, which cover the first work function metal-containing layer 312A in this stated order. The isolation stack structure SL3 may further include a fourth work function metal-containing layer 316B and a second gap-fill metal-containing layer 318B, which cover the second work function metal-containing layer 312B in this stated order. The third and fourth work function metal-containing layers 316A and 316B may have mostly the same configurations as the third and fourth work function metal-containing layers 216A and 216B described above with reference to FIG. 4, respectively. The first gap-fill metal-containing layer 318A may fill a space remaining above the third work function metal-containing layer 316A in the gate space GS1. The second gap-fill metal-containing layer 318B may fill a space remaining above the fourth work function metal-containing layer 316B in the gate space GS2. In the gate spaces GS1 and GS2 having the same width and height, the thickness of the first work function metal-containing layer 312A included in the gate stack structure GL2 is greater than the thickness of the second work function metal-containing layer 312B included in the isolation stack structure SL3, and consequently the thickness of the first gap-fill metal-containing layer 318A may be less than the thickness of the second gap-fill metal-containing layer 318B. Details of the first and second gap-fill metal-containing layers 318A and 318B are mostly the same as the details of the first and second gap-fill metal-containing layers 218A and 218B described above with reference to FIG. 4.

In the integrated circuit device 100C, the gate stack structure GL2 may have a certain effective work function for the first transistor TR1 to have a target threshold voltage required for the normal operation of a PMOS transistor, for example, an effective work function selected from a range of about 4.8 eV to about 5.2 eV. On the other hand, a transistor including the isolation stack structure SL3 may have a threshold voltage that is higher than the target threshold voltage required for the normal operation of a PMOS transistor. To achieve this, the isolation stack structure SL3 constituting the fin isolation region FS may have an effective work function that is lower than the effective work function of the gate stack structure GL2. For example, the isolation stack structure SL3 may have an effective work function of about 4.5 eV or less, without being limited thereto. Since the isolation stack structure SL3 has a lower effective work function than the gate stack structure GL2, the transistor including the isolation stack structure SL3 does not operate and may function as an isolation region in the fin-type active region FA, when the first transistor TR1 operates normally as a PMOS transistor.

Figure 7:
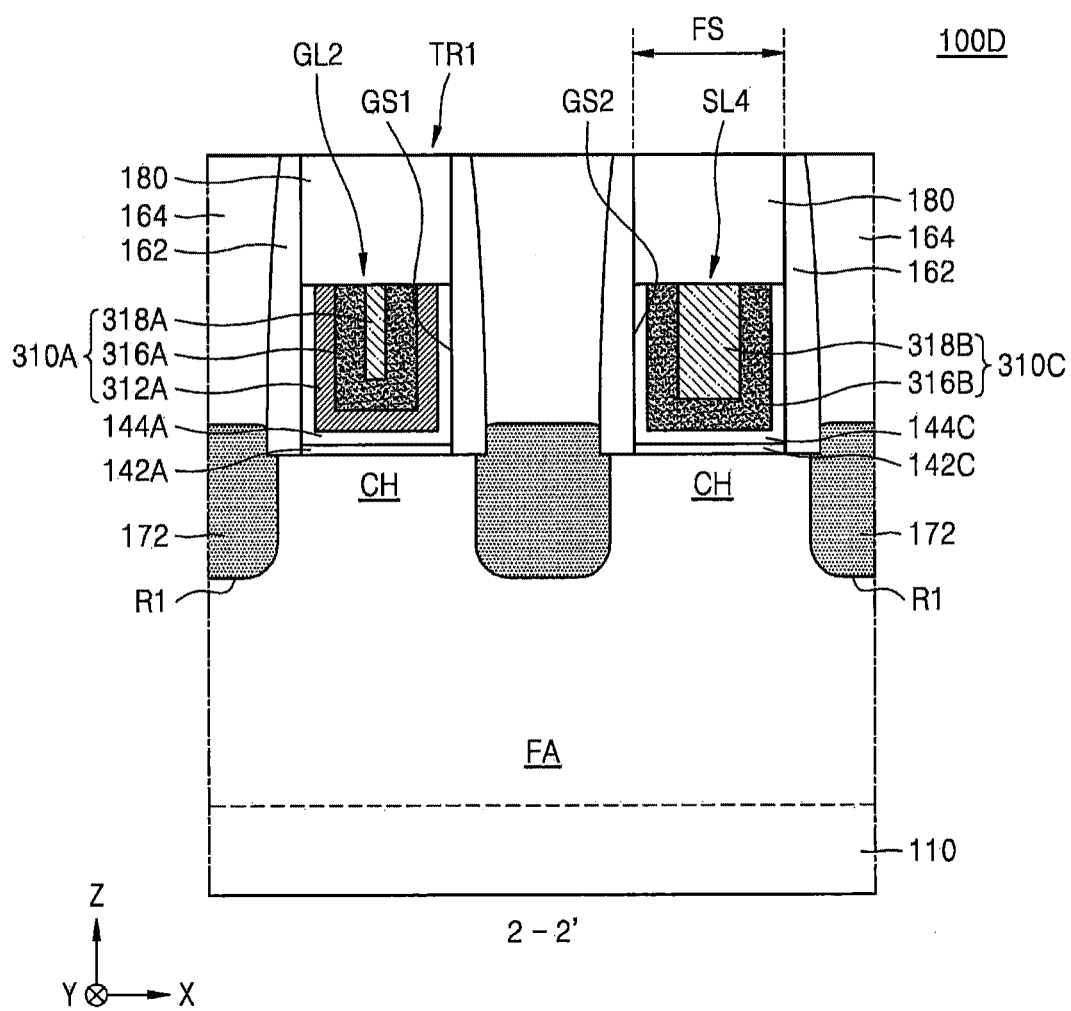

Referring to FIG. 7, the integrated circuit device 100D has mostly the same configuration as the integrated circuit device 100C shown in FIG. 6. However, in the integrated circuit device 100D shown in FIG. 7, the isolation stack structure SL4 has a conductive stack structure 310C. Unlike the conductive stack structure 310B of the isolation stack structure SL3 shown in FIG. 6, the conductive stack structure 310C may not include a PMOS work function adjusting metal-containing layer. Thus, the fourth work function metal-containing layer 316B may be directly formed on the third gate insulating layer 144C.

Since in the integrated circuit device 100D the isolation stack structure SL4 does not include the PMOS work function adjusting metal-containing layer, a transistor including the isolation stack structure SL4 in the fin isolation region FS may have a higher threshold voltage than the transistor including the isolation stack structure SL3 shown in FIG. 6.

Figure 8:
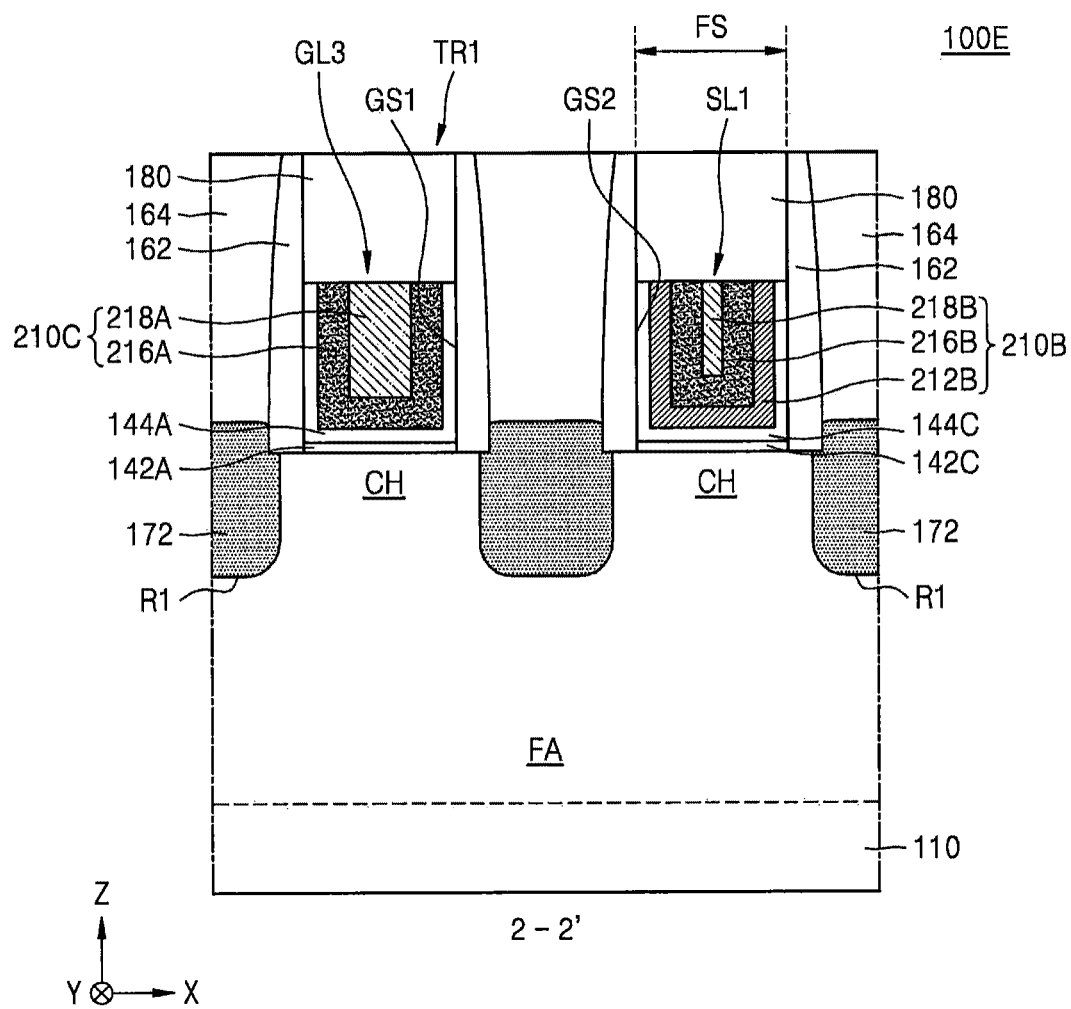

Referring to FIG. 8, the integrated circuit device 100E has mostly the same configuration as the integrated circuit device 100A shown in FIG. 4. However, the integrated circuit device 100E shown in FIG. 8 has the gate stack structure GL3. A conductive stack structure 210C of the gate stack structure GL3 does not include a PMOS work function adjusting metal-containing layer. Thus, the third work function metal-containing layer 216A may be directly formed on the first gate insulating layer 144A.

In the integrated circuit device 100E, since the gate stack structure GL3 does not include the PMOS work function adjusting metal-containing layer, the first transistor TR1 of the integrated circuit device 100E shown in FIG. 8 may operate at a lower threshold voltage than the first transistor TR1 of the integrated circuit device 100A shown in FIG. 4. The transistor including the isolation stack structure SL1 in the fin isolation region FS has a threshold voltage that is higher than the target threshold voltage for the normal operation of the first transistor TR1 of the integrated circuit device 100E, and hence the transistor including the isolation stack structure SL1 does not operate and may function as an isolation region of the fin-type active region FA when the first transistor TR1 operates normally as a low voltage NMOS transistor.

In some embodiments, the third and fourth work function metal-containing layers 216A and 216B may include TiAlC, TiAlN, or other Al-containing metal nitrides, or combinations thereof, and may have different Al contents from each other. To further increase a difference between the threshold voltage of the transistor including the isolation stack structure SL1 in the fin isolation region FS and the target threshold voltage for the first transistor TR to operate normally as an NMOS transistor, the Al content in the fourth work function metal-containing layer 216B may be lower than the Al content in the third work function metal-containing layer 216A. For example, the Al content in the third work function metal-containing layer 216A may range from about 12% atomic percentage to about 15% atomic percentage, and the Al content in the fourth work function metal-containing layer 216B may be about 10% atom percentage or less, without being limited thereto.

Figure 9:
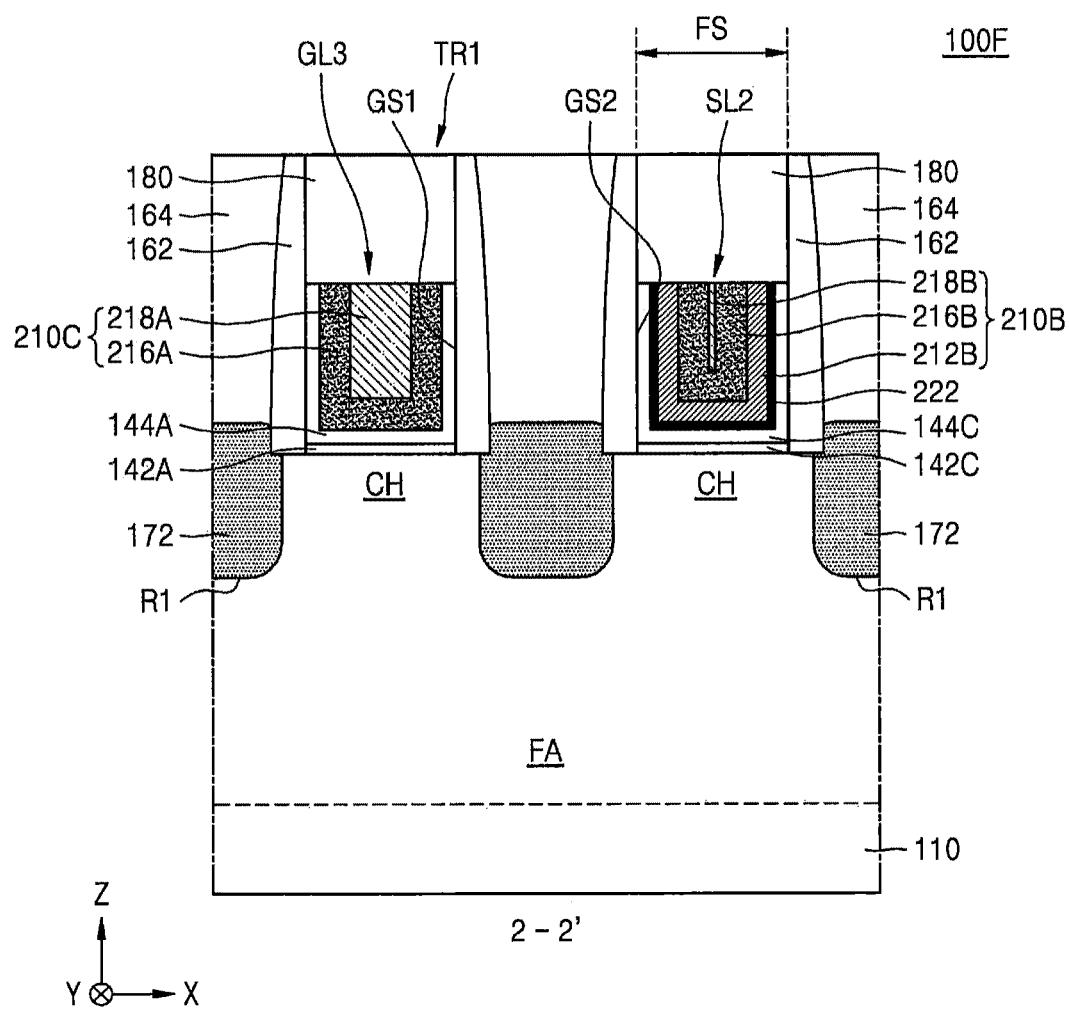

Referring to FIG. 9, the integrated circuit device 100F has mostly the same configuration as the integrated circuit device 100E shown in FIG. 8. However, unlike the isolation stack structure SL1 of the integrated circuit device 100E shown in FIG. 8, the isolation stack structure SL2 of the integrated circuit device 100F shown in FIG. 9 further includes the La-containing layer 222 between the third gate insulating layer 144C and the second work function metal-containing layer 212B.

The integrated circuit device 100F includes the isolation stack structure SL2 including the La-containing layer 222, and thus the transistor including the isolation stack structure SL2 in the fin isolation region FS may have a higher threshold voltage than the transistor including the isolation stack structure SL1 shown in FIG. 8.

Figure 10:
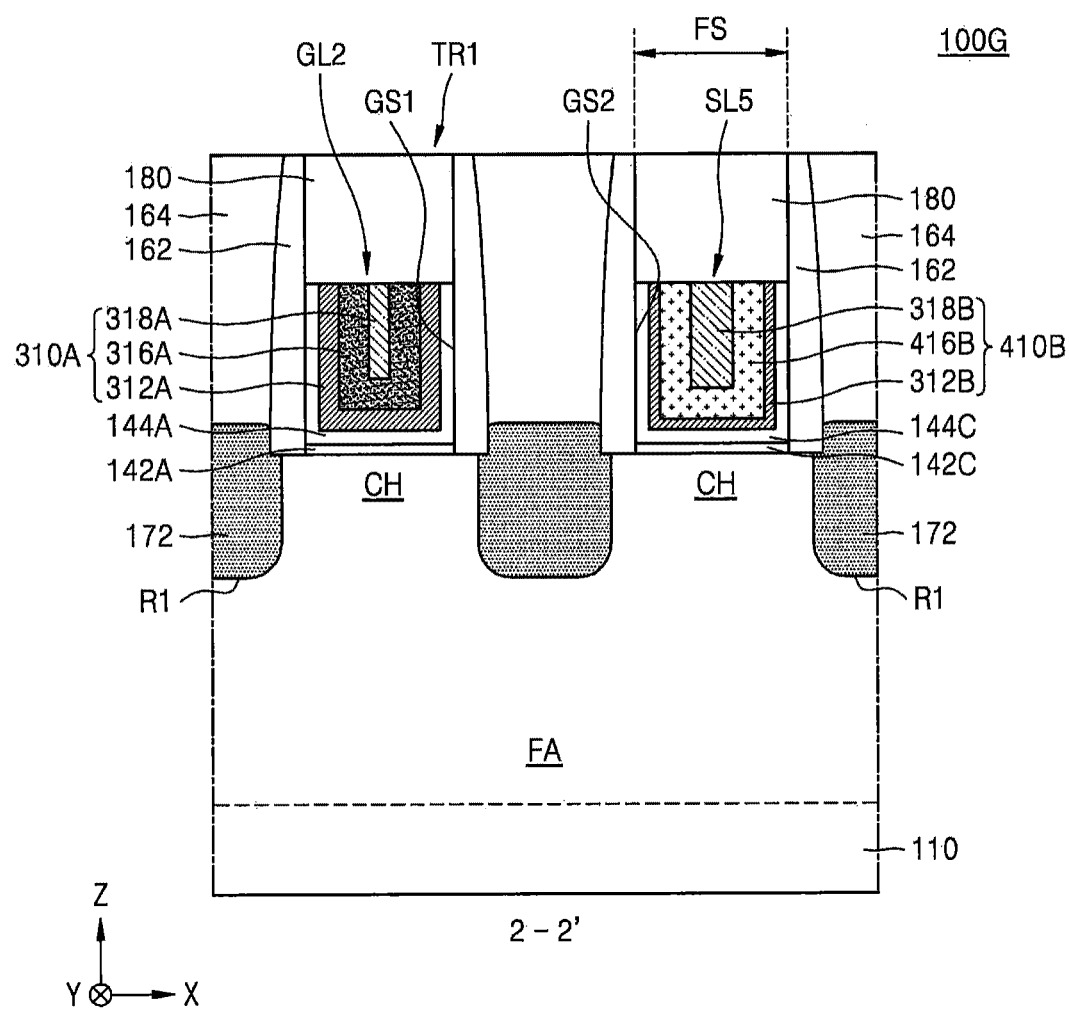

Referring to FIG. 10, the integrated circuit device 100G has mostly the same configuration as the integrated circuit device 100C shown in FIG. 6. However, the integrated circuit device 100G shown in FIG. 10 includes the isolation stack structure SL5. A conductive stack structure 410B of the isolation stack structure SL5 includes, instead of the fourth work function metal-containing layer 316B shown in FIG. 6, a fourth work function metal-containing layer 416B having a higher Al content than the third work function metal-containing layer 316A. This design further increases a difference between the threshold voltage of a transistor including the isolation stack structure SL5 in the fin isolation region FS and the target threshold voltage for the first transistor TR1 to operate normally as a PMOS transistor. For example, the Al content in the third work function metal-containing layer 316A may range from about 12% atomic percentage to about 15% atomic percentage, and the Al content in the fourth work function metal-containing layer 416B may be about 20% atomic percentage or more, without being limited thereto.

The isolation stack structure SL5 includes the fourth work function metal-containing layer 416B having a higher Al content than the third work function metal-containing layer 316A, and thus the transistor including the isolation stack structure SL5 may have a threshold voltage that is higher than the target threshold voltage required for the first transistor TR1 to operate normally as a PMOS transistor. Thus, when the first transistor TR1 operates normally as a PMOS transistor, the transistor including the isolation stack structure SL5 does not operate and may function as an isolation region in the fin-type active region FA.

Figure 11:
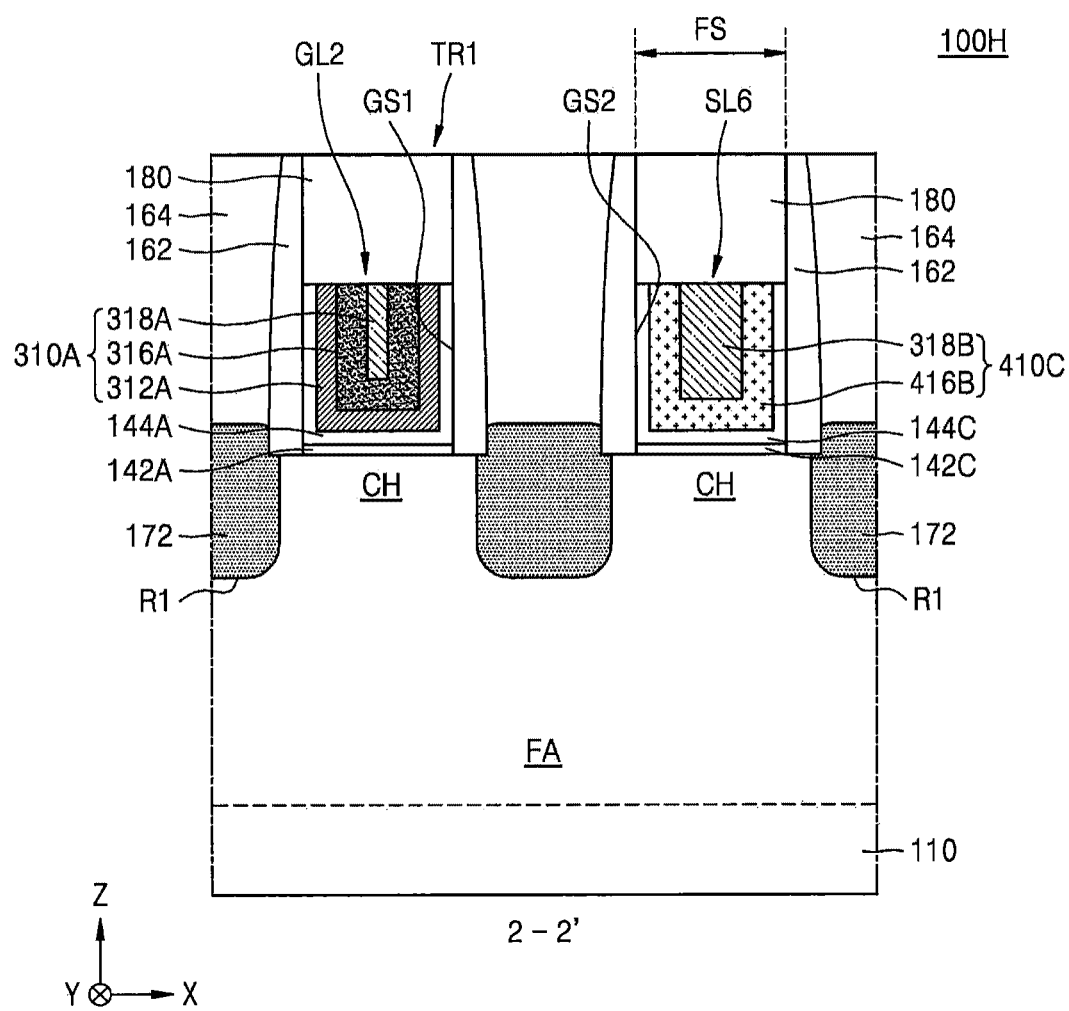

Referring to FIG. 11, the integrated circuit device 100H has mostly the same configuration as the integrated circuit device 100D shown in FIG. 7. However, the integrated circuit device 100H shown in FIG. 11 includes the isolation stack structure SL6. A conductive stack structure 410C of the isolation stack structure SL6 includes, instead of the fourth work function metal-containing layer 316B shown in FIG. 7, the fourth work function metal-containing layer 416B having a higher Al content than the third work function metal-containing layer 316A. Thus, when the first transistor TR1 operates normally as a PMOS transistor, a transistor including the isolation stack structure SL6 does not operate and may function as an isolation region in the fin-type active region FA.

Figure 12:
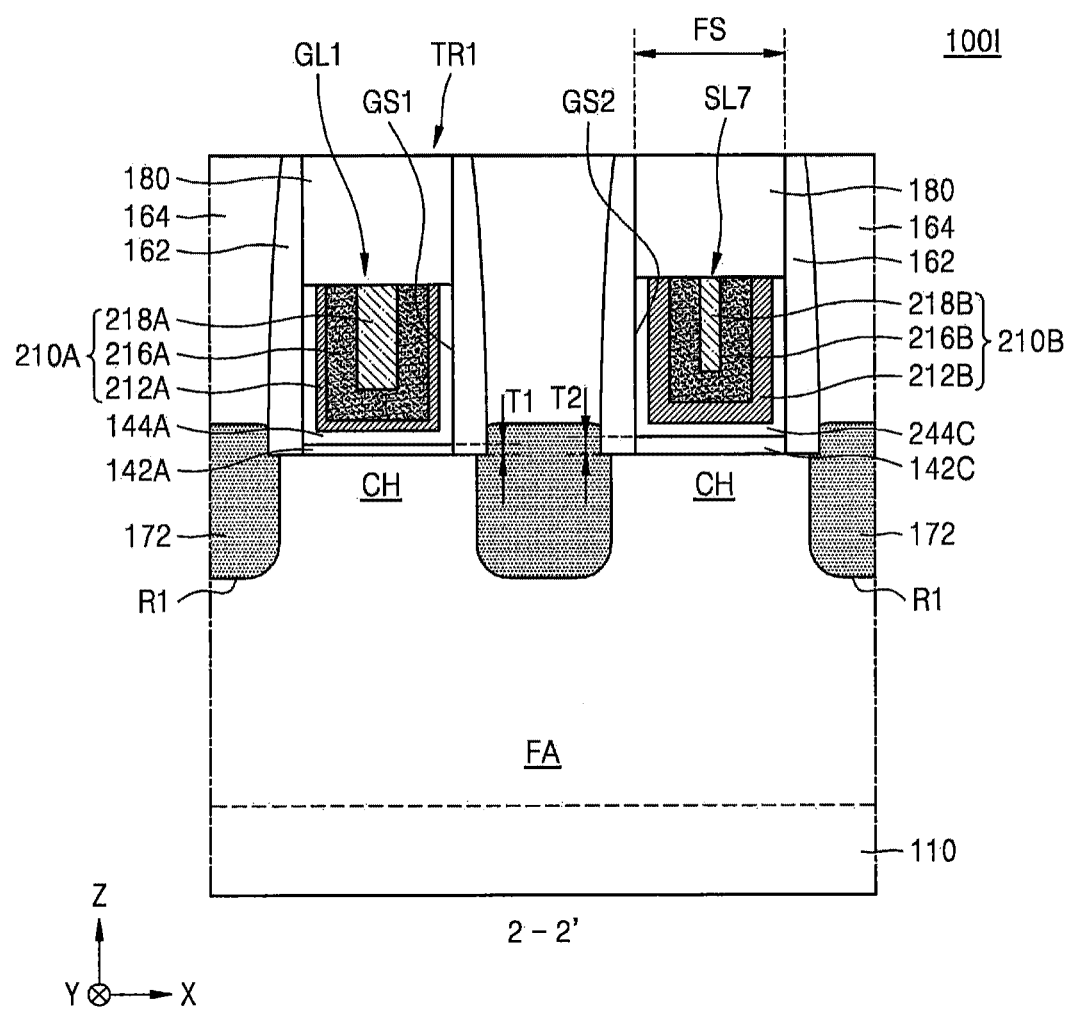

Referring to FIG. 12, the integrated circuit device 100I has mostly the same configuration as the integrated circuit device 100A shown in FIG. 4. However, in the integrated circuit device 100I shown in FIG. 12, a thickness T2 of the third interfacial layer 142C of the isolation stack structure SL7 in the fin isolation region FS may be greater than a thickness T1 of the first interfacial layer 142A of the gate stack structure GL1.

Since the thickness T2 of the third interfacial layer 142C of the isolation stack structure SL7 is greater than the thickness T1 of the first interfacial layer 142A of the first transistor T1 operating as an NMOS transistor, a threshold voltage of a transistor including the isolation stack structure SL7 may be higher than the threshold voltage of the first transistor TR1.

Figure 13:
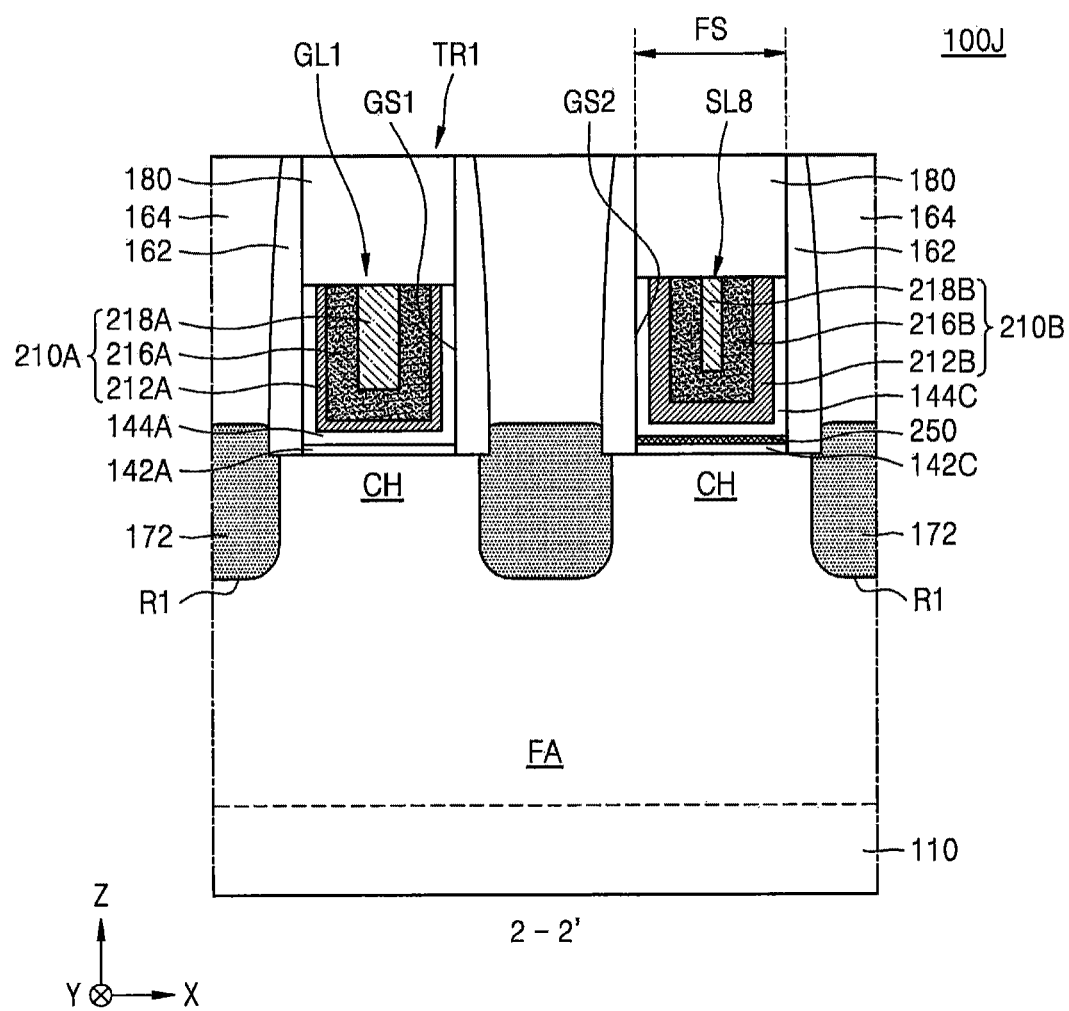

Referring to FIG. 13, the integrated circuit device 100J has mostly the same configuration as the integrated circuit device 100A shown in FIG. 4. However, in the integrated circuit device 100J shown in FIG. 13, the isolation stack structure SL8 in the fin isolation region FS further includes a fluorine-containing layer 250 between the third interfacial layer 142C and the third gate insulating layer 144C.

Since the isolation stack structure SL8 includes the fluorine-containing layer 250, a threshold voltage of a transistor including the isolation stack structure SL8 may be higher than the threshold voltage of the first transistor TR1 operating as an NMOS transistor.

Figure 14:
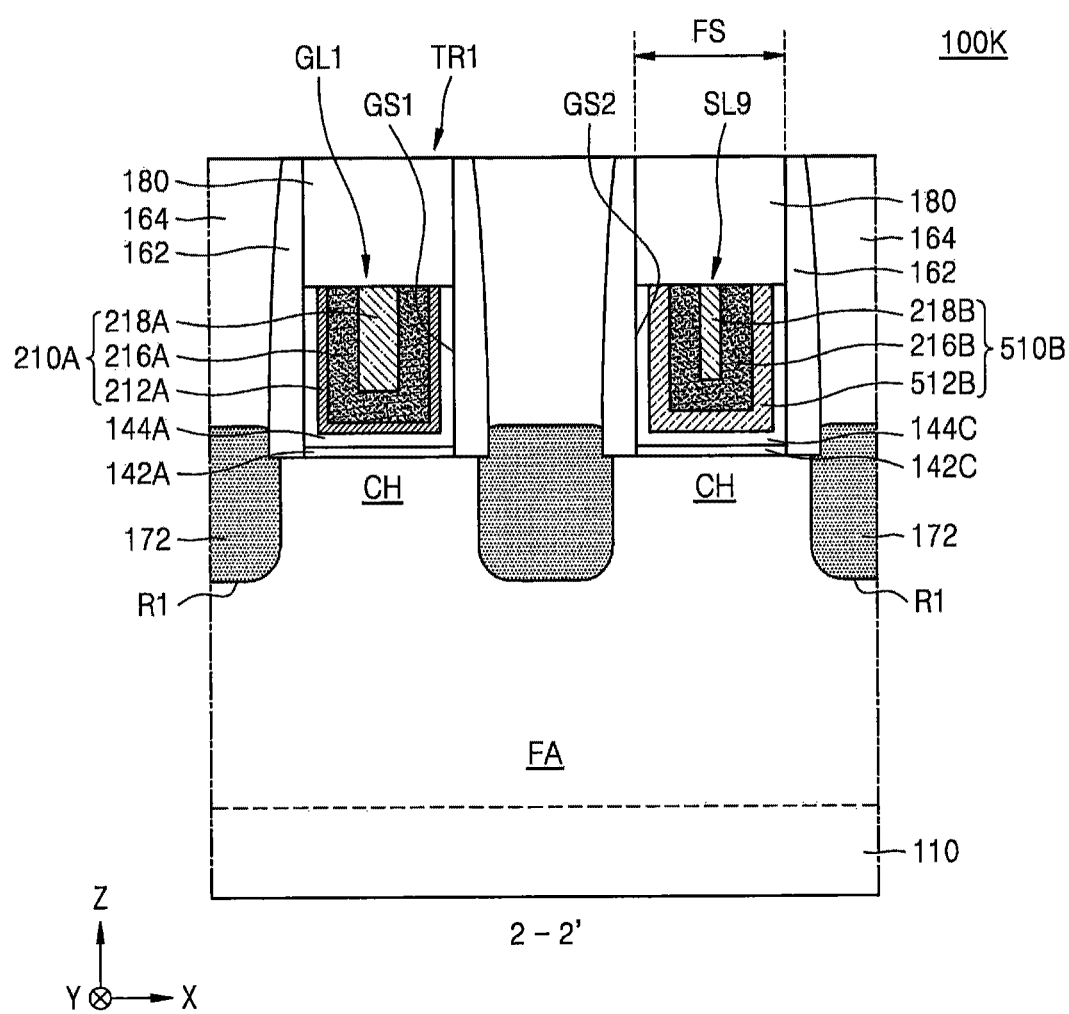

Referring to FIG. 14, the integrated circuit device 100K has mostly the same configuration as the integrated circuit device 100A shown in FIG. 4. However, the integrated circuit device 100K shown in FIG. 14 includes, instead of the second work function metal-containing layer 212B shown in FIG. 4, a second work function metal-containing layer 512B that is doped with Si atoms.

In more detail, in the integrated circuit device 100K, although the first work function metal-containing layer 212A of the gate stack structure GL1 and the second work function metal-containing layer 512B of the isolation stack structure SL9 include the same conductive metal nitride, the second work function metal-containing layer 512B is selectively doped with Si atoms while the first work function metal-containing layer 212A is not doped with Si atoms and hence is devoid of Si atoms. For example, the first work function metal-containing layer 212A may include TiN or TaN, and the second work function metal-containing layer 512B may include TiNSi or TaNSi. In addition, the second work function metal-containing layer 512B may have a greater thickness than the first work function metal-containing layer 212A.

Since the isolation stack structure SL9 includes the second work function metal-containing layer 512B doped with Si atoms, a threshold voltage of a transistor including the isolation stack structure SL9 may be higher than the threshold voltage of the first transistor TR1 operating as an NMOS transistor.

Hereinafter, methods of fabricating integrated circuit devices according to certain embodiments of the inventive concepts will be described in detail.

FIGS. 15A to 18B are cross-sectional views illustrating sequential processes of a method of fabricating integrated circuit devices according to certain embodiments of the inventive concept. In particular, FIGS. 15A, 16A, 17A, and 18A are cross-sectional views illustrating a partial area of the integrated circuit device, which correspond to a portion of a cross-section taken along the line 2-2' of FIG. 1, and FIGS. 15B, 16B, 17B, and 18B are cross-sectional views illustrating partial areas of the integrated circuit device, which correspond to cross-sections taken along the lines 3A-3A' and 3B-3B'. A method of fabricating the integrated circuit device 100 shown in FIGS. 1 to 3 will be described with reference to FIGS. 15A to 18B.

Figure 15A:
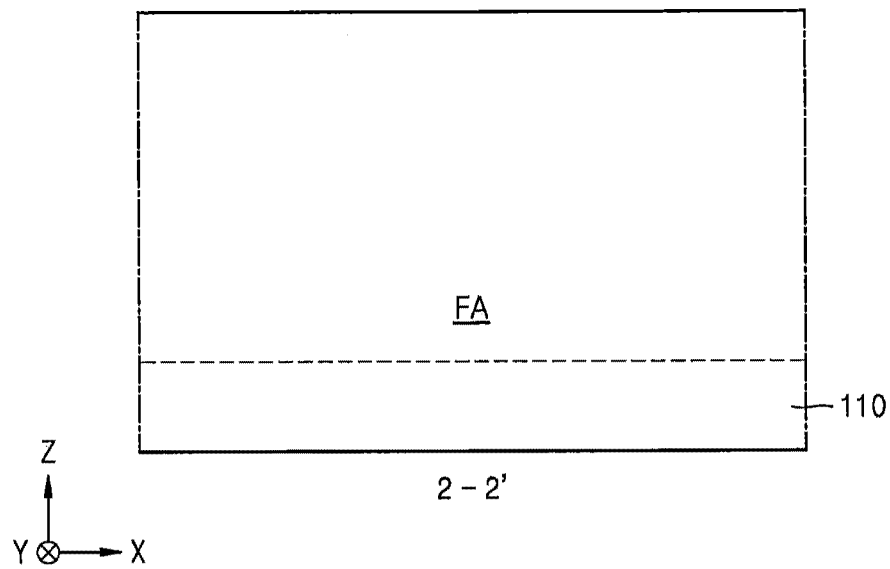
Figure 15B:
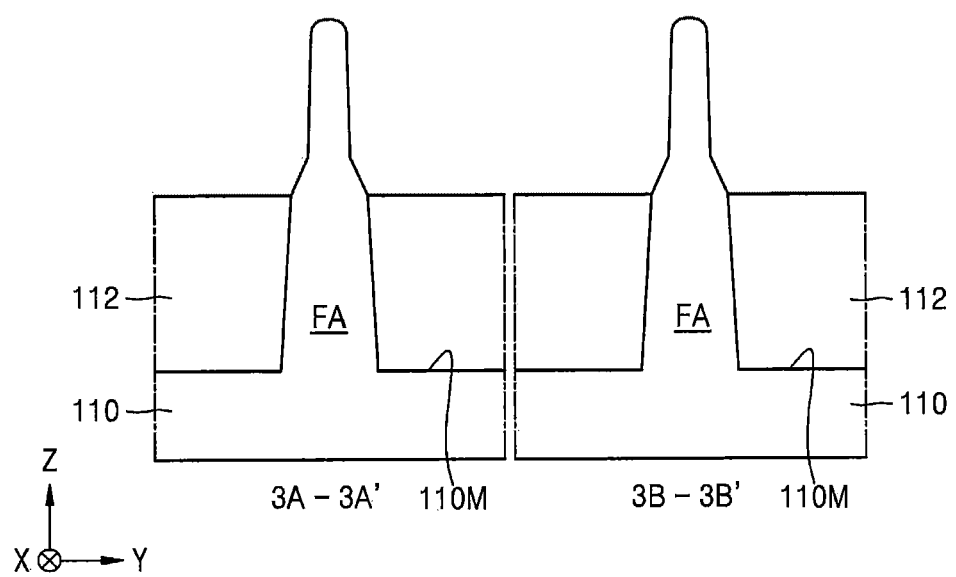

Referring to FIGS. 15A and 15B, some areas of the substrate 110 are etched, thereby forming the fin-type active region FA, which protrudes upwards (Z direction) from the main plane 110M of the substrate 110 and extends in one direction (X direction).

The substrate 110 may have a metal oxide semiconductor (MOS) area. For example, the substrate 110 may have a PMOS area or an NMOS area. For example, a portion of the substrate 110, which is shown in FIGS. 15A and 15B, may be an area for forming one conductivity-type transistor (i.e., a PMOS transistor or an NMOS transistor).

An insulating layer is formed on the substrate 110 and covers the fin-type active region FA. An etch-back process if performed on the insulating layer to form the device isolation layer 112. The fin-type active region FA may protrude upwards from a top surface of the device isolation layer 112. To form the device isolation layer 112, a plasma enhanced chemical vapor deposition (PECVD), high density plasma CVD (HDP CVD), inductively coupled plasma CVD (ICP CVD), capacitor coupled plasma CVD (CCP CVD), flowable chemical vapor deposition (FCVD), or spin coating process may be used.

Figure 16A:
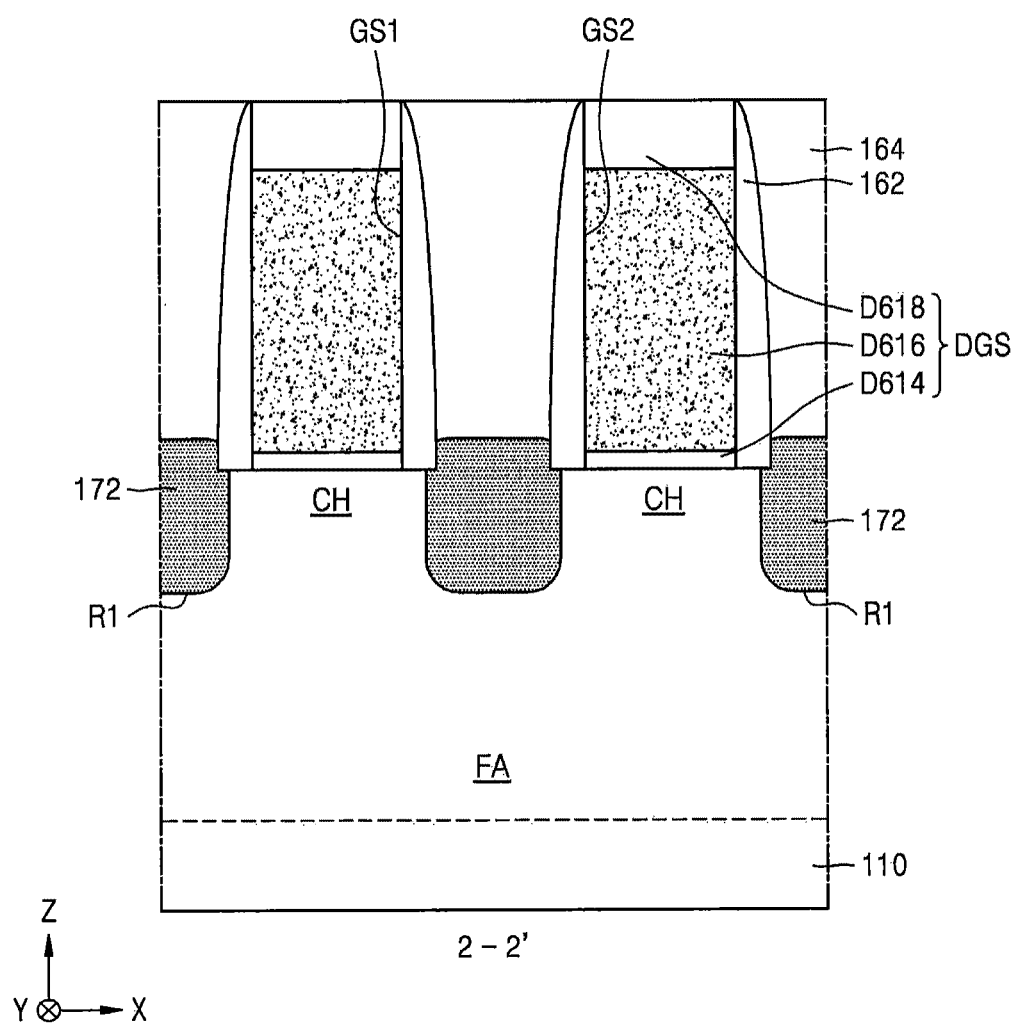
Figure 16B:
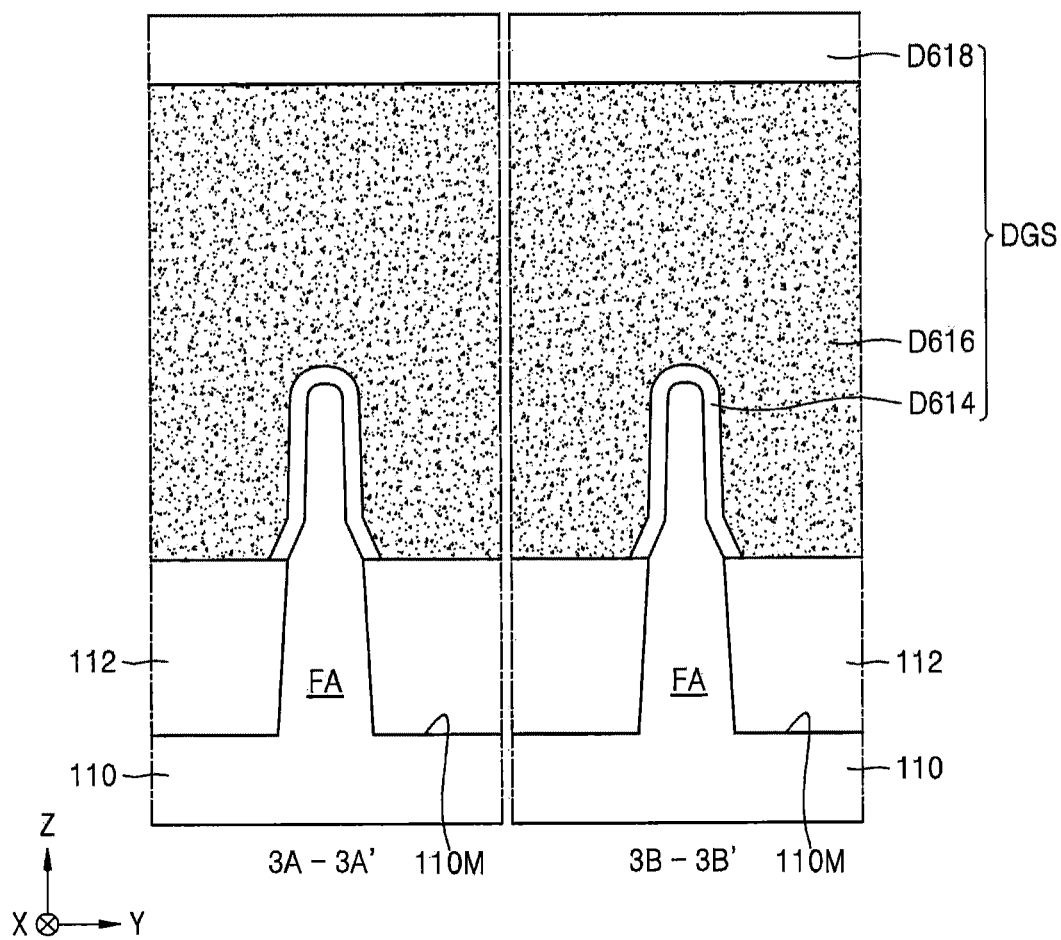

Referring to FIGS. 16A and 16B, a plurality of dummy gate structures DGS are formed on the fin-type active region FA. The dummy gate structures DGS extend in a second direction (Y direction) to intersect the fin-type active region FA.

Each of the dummy gate structures DGS may include a dummy gate insulating layer D614, a dummy gate line D616, and a dummy gate capping layer D618, which are stacked on the fin-type active region FA in this stated order. In some embodiments, the dummy gate insulating layer D614 may include silicon oxide. The dummy gate line D616 may include polysilicon. The dummy gate capping layer D618 may include at least one of silicon oxide, silicon nitride, and silicon oxynitride.

Next, an insulating spacer 162 is formed on both sidewalls of each dummy gate structure DGS. To form the insulating spacer 162, an atomic layer deposition (ALD) or CVD process may be used.

Next, a plurality of recess regions R1 are formed by etching portions of the fin-type active region FA, which are exposed on both sides of the dummy gate structures DGS. A plurality of source/drain regions 172 are formed by forming a semiconductor layer in the recess regions R1 by an epitaxial growth process. The source/drain regions 172 may have top surfaces that are at higher levels than the top surface of the fin-type active region FA, without being limited thereto. Cross-sectional shapes of the source/drain regions 172, which are cut along a Y-Z plane, may be circular shapes, elliptical shapes, or polygonal shapes such as quadrangles, pentagons, or hexag Next, an inter-gate dielectric 164 is formed that covers the source/drain regions 172.

In some embodiments, to form the inter-gate dielectric 164, an insulating layer may be formed to a sufficient thickness to cover the source/drain regions 172, the dummy gate structures DGS, and the insulating spacer 162. Next, the resultant structure including the insulating layer may be planarized such that a top surface of the dummy gate capping layer D618 is exposed, thereby forming the inter-gate dielectric 164 having a planarized top surface.

Figure 17A:
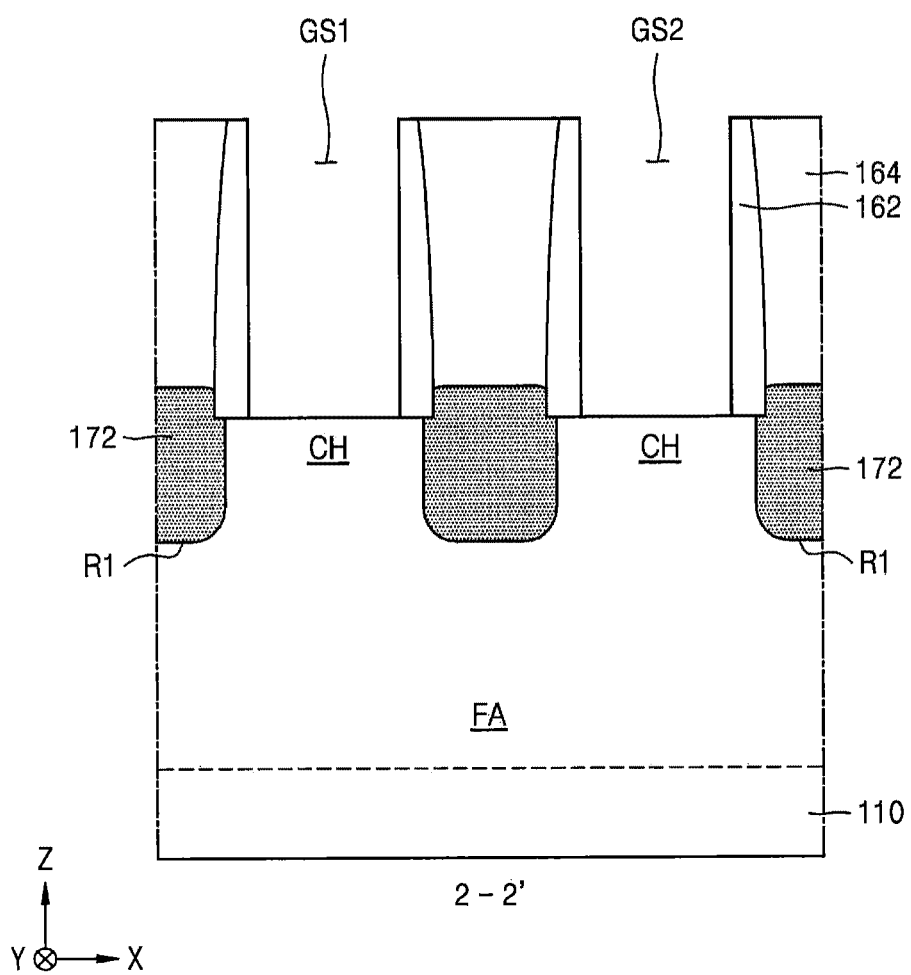
Figure 17B:
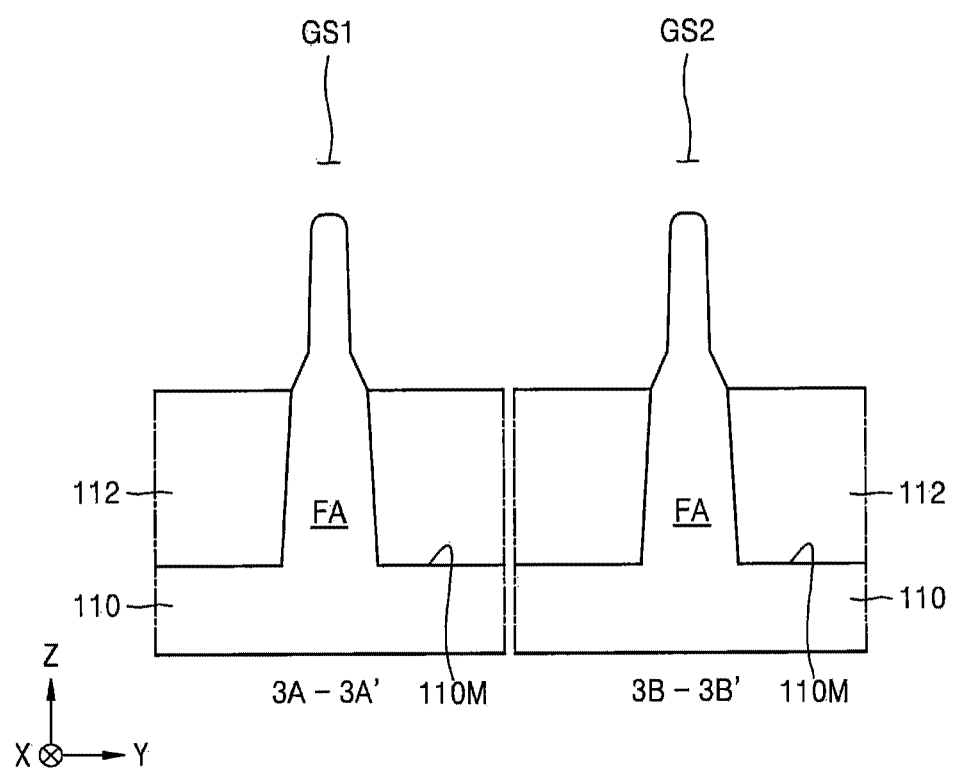

Referring to FIGS. 17A and 17B, the dummy gate structures DGS are removed from the structure of FIGS. 16A and 16B, thereby forming a plurality of gate spaces GS1 and GS2. The insulating spacer 162, the fin-type active region FA, and the device isolation layer 112 may be exposed by the gate spaces GS1 and GS2.

To remove the dummy gate structures DGS, a wet etching process may be used. To perform the wet etching process, an etching solution which includes nitric acid ($HNO_3$), diluted fluoric acid (DHF), $NH_4OH$, tetramethylammonium hydroxide (TMAH), potassium hydroxide (KOH), or combinations thereof, may be used, without being limited thereto.

Figure 18A:
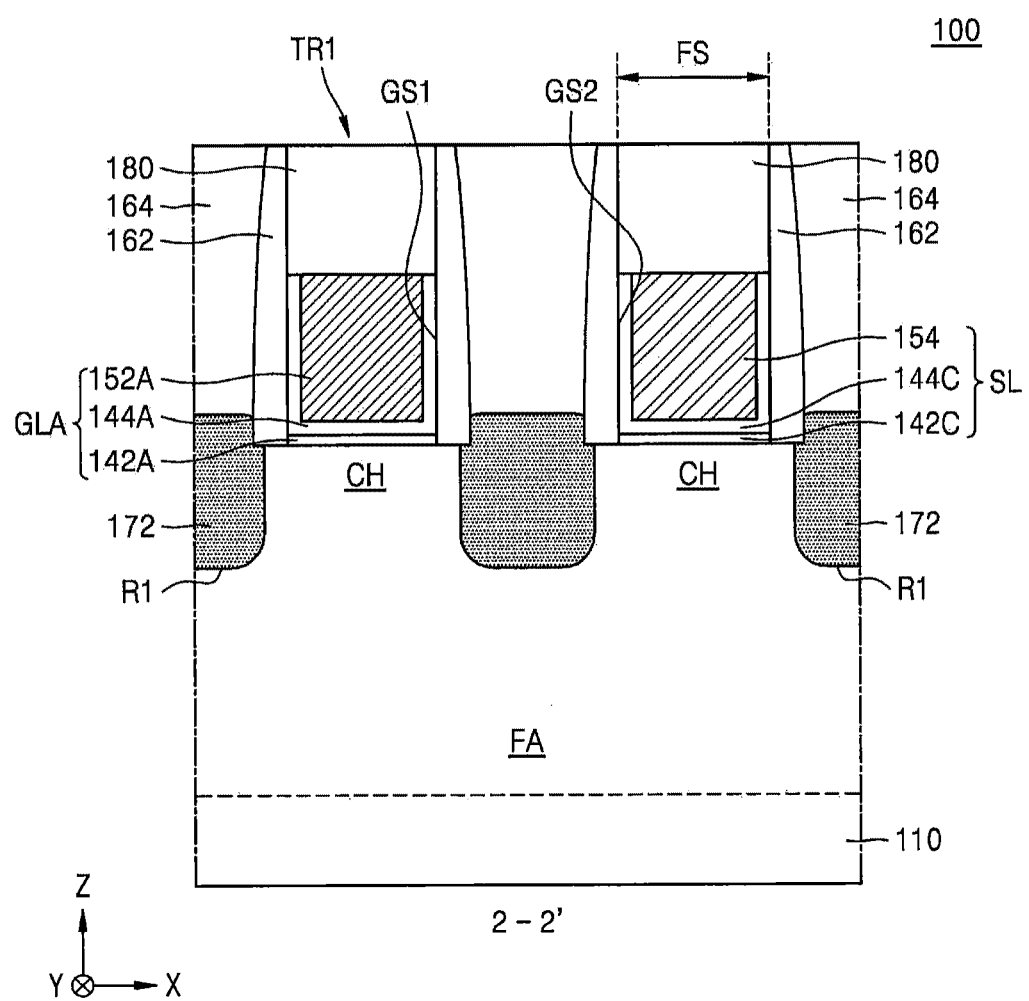
Figure 18B:
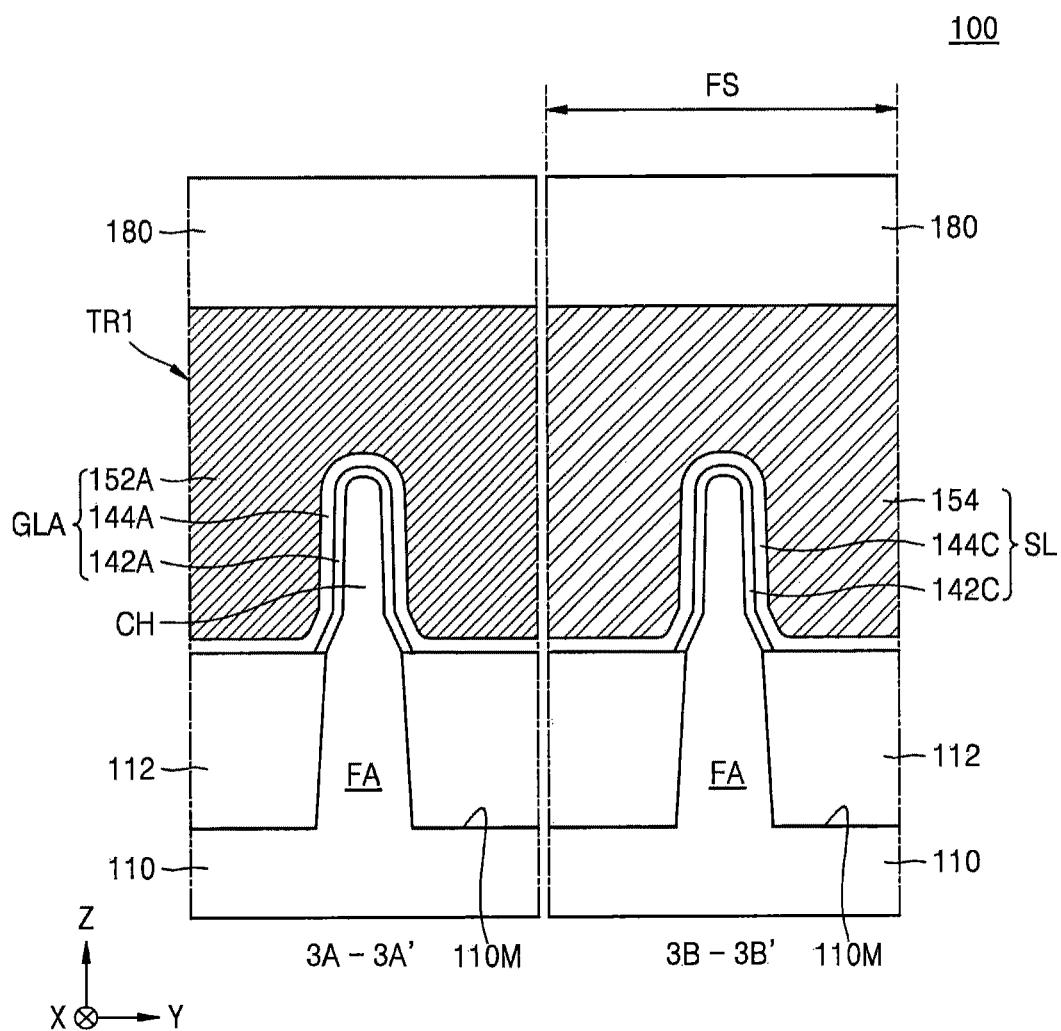

Referring to FIGS. 18A and 18B, the first and third interfacial layers 142A and 142C, the first and third gate insulating layers 144A and 144C, the first conductive stack structure 152A, and the isolation conductive stack structure 154 are formed to fill the gate spaces GS1 and GS2, thereby forming the first gate stack structure GLA and the isolation stack structure SL, which respectively fill the gate spaces GS1 and GS2.

To form the first and third interfacial layers 142A and 142C, portions of the fin-type active region FA, which are exposed by the plurality of gate spaces GS1 and GS2, may be oxidized. The first and third interfacial layers 142A and 142C may be simultaneously formed by such an oxidation process. The first and third gate insulating layers 144A and 144C, the first conductive stack structure 152A, and the isolation conductive stack structure 154 may be formed to cover the top surface of the inter-gate dielectric 164 while filling the gate spaces GS1 and GS2. The first and third gate insulating layers 144A and 144C may be simultaneously formed by an ALD, CVD, or physical vapor deposition (PVD) process. Each of the first conductive stack structure 152A and the isolation conductive stack structure 154 may be formed by an ALD, CVD, PVD, metal organic ALD (MOALD), or metal organic CVD (MOCVD) process. Next, unnecessary portions of the first and third gate insulating layers 144A and 144C, the first conductive stack structure 152A, and the isolation conductive stack structure 154 are removed such that upper portions of the gate spaces GS1 and GS2 are emptied and the top surface of the inter-gate dielectric 164 is exposed. The insulating capping layer 180 may be formed in the upper portions of the gate spaces GS1 and GS2 and may cover the first gate stack structure GLA and the isolation stack structure SL.

The first gate stack structure GLA may have one of the gate stack structures GL1, GL2 and GL3 that are described above with reference to FIGS. 4 to 14 and gate stack structures modified and changed therefrom without departing from the spirit and scope of the inventive concept. In other words, while the gate stack structure in FIGS. 18A-18B is illustrated as including the first interfacial layer 142A, the first gate insulating layer 144A and the first conductive stack structure 152A, it will be appreciated that the first gate stack structure GLA may be formed to have any of the gate stack structures GL1, GL2 and GL3 that are described above. Likewise, the isolation stack structure SL may have any one of the isolation stack structures SL1, SL2, SL3, SL4, SL5, SL6, SL7, SL8, and SL9 described with reference to FIGS. 4 to 14 and isolation stack structures modified and changed therefrom without departing from the spirit and scope of the inventive concept.

Although the method of fabricating the integrated circuit device 100 shown in FIGS. 1 to 3 has been described with reference to FIGS. 15A to 18B, the integrated circuit devices 100A to 100K shown in FIGS. 4 to 14 and integrated circuit devices having various structures modified and changed therefrom may be fabricated by various modifications and changes of the inventive concept without departing from the spirit and scope of the inventive concept.

Figure 19A:
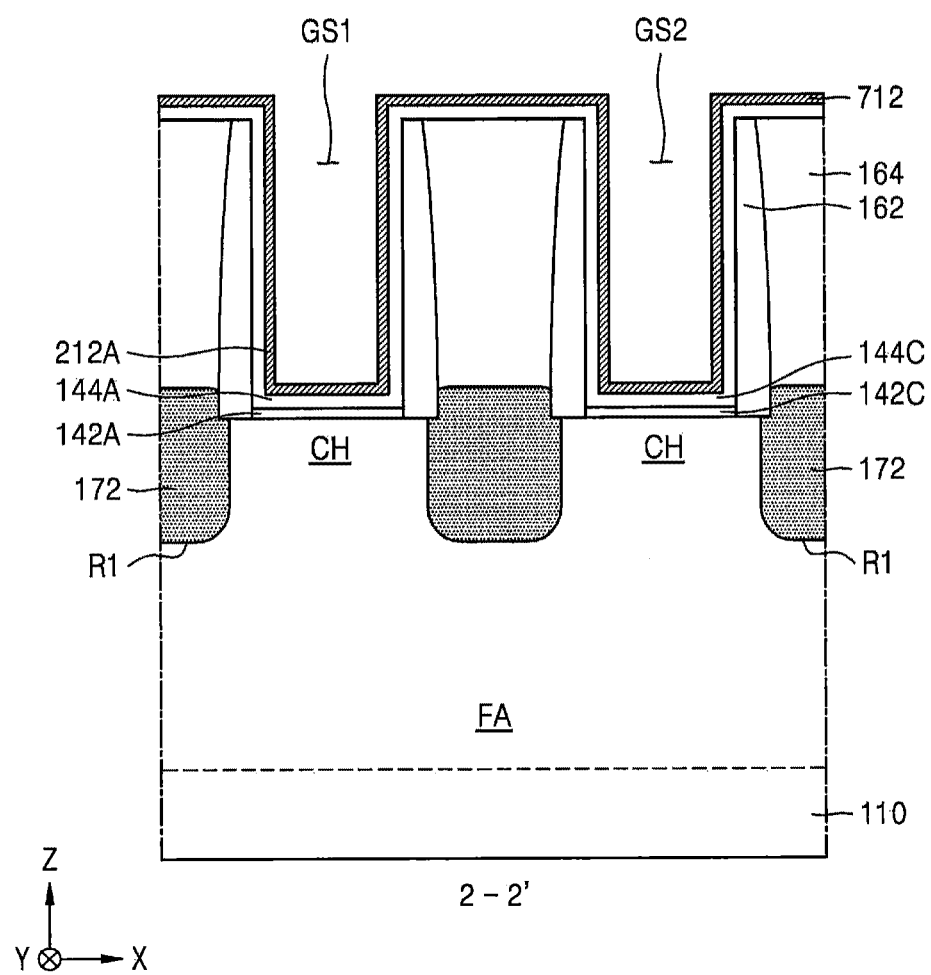
FIGS. 19A to 19C are cross-sectional views illustrating a method of fabricating an integrated circuit device, according to other embodiments of the inventive concepts.
Figure 19B:
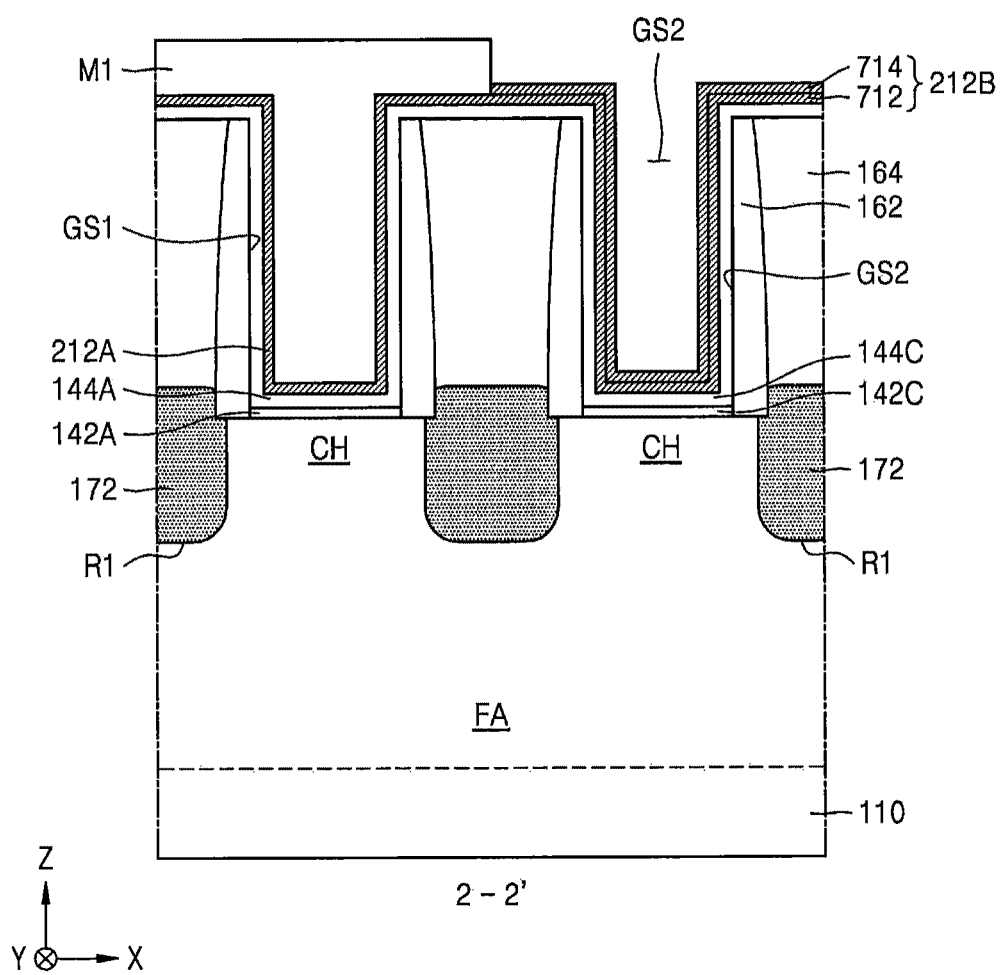
Figure 19C:
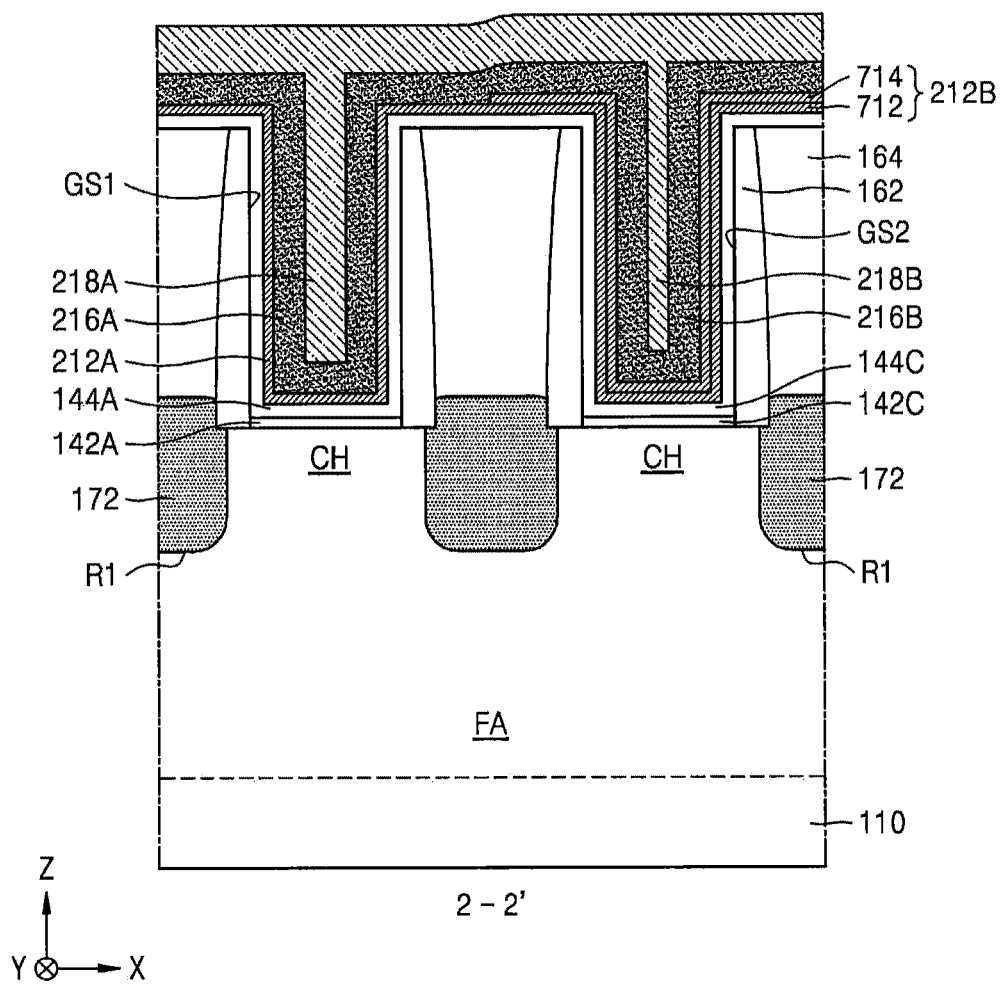

FIGS. 19A to 19C are schematic cross-sectional views illustrating sequential processes of a method of fabricating the integrated circuit device 100A shown in FIG. 4. In FIGS. 19A to 19C, the same reference numerals as in FIGS. 1 to 4 denote the same members, and descriptions thereof will be omitted.

Referring to FIG. 19A, the gate spaces GS1 and GS2 are formed using the same method as described with reference to FIGS. 17A and 17B, followed by forming the first and third interfacial layers 142A and 142C and the first and third gate insulating layers 144A and 144C in the gate spaces GS1 and GS2. Next, a first conductive layer 712 is formed on the first and third gate insulating layers 144A and 144C. The portion of the first conductive layer 712 that is formed on the first gate insulating layer 144A may have the same thickness as the portion of the first conductive layer 712 that is formed on the third gate insulating layer 144C. A portion of the first conductive layer 712, which is formed within the gate space GS1 may be the first work function metal-containing layer 212A.

Referring to FIG. 19B, while the gate space GS1 and surrounding regions thereof are covered with a mask pattern M1, a second conductive layer 714 is formed on and covering the first conductive layer 712 in the gate space GS2 that is to be the fin isolation region FS, thereby forming the second work function metal-containing layer 212B including the first conductive layer 712 and the second conductive layer 714. The first and second conductive layers 712, 714 may comprise the same material in some embodiments.

Referring to FIG. 19C, the mask pattern M1 is removed, and then the third work function metal-containing layer 216A and the fourth work function metal-containing layer 216B are formed to have the same thickness on the first work function metal-containing layer 212A and the second work function metal-containing layer 212B, respectively. Next, the first gap-fill metal-containing layer 218A and the second gap-fill metal-containing layer 218B may be formed to respectively fill spaces remaining in the gate spaces GS1 and GS2.

Next, in a similar method to the method described with reference to FIGS. 18A and 18B, unnecessary portions of the first and third gate insulating layers 144A and 144C, the first and second work function metal-containing layers 212A and 212B, the third and fourth work function metal-containing layers 216A and 216B, and the first and second gap-fill metal-containing layers 218A and 218B are removed, thereby forming the gate stack structure GL1 and the isolation stack structure SL1 (see FIG. 4), which respectively fill the gate space GS1 and the gate space GS2.

To fabricate the integrated circuit device 100B shown in FIG. 5, a similar method to the method described with reference to FIGS. 19A to 19C may be used. However, in the process described with reference to FIG. 19A, the La-containing layer 222 may be selectively formed only in the gate space GS2 and the surrounding regions thereof, before the deposition of the first conductive layer 712, after the formation of the first and third gate insulating layers 144A and 144C. Next, the first conductive layer 712 is formed on the La-containing layer 222, followed by performing the processes of FIGS. 19A to 19C.

To fabricate the integrated circuit device 100C shown in FIG. 6, a similar method to the method described with reference to FIGS. 19A to 19C may be used. However, the second work function metal-containing layer 312B in the gate space GS2 may have a smaller thickness than the first work function metal-containing layer 312A in the gate space GS1.

To fabricate the integrated circuit device 100D shown in FIG. 7, a similar method to the method described with reference to FIGS. 19A to 19C may be used. However, after the first and third interfacial layers 142A and 142C and the first and third gate insulating layers 144A and 144C are formed in the gate spaces GS1 and GS2 as described with reference to FIG. 19A, the first work function metal-containing layer 312A may be formed only in the gate space GS1 and not in the gate space GS2. Next, the third work function metal-containing layer 316A, which covers the first work function metal-containing layer 312A in the gate space GS1, and the fourth work function metal-containing layer 316B, which covers the third gate insulating layer 144C in the gate space GS2, may be simultaneously formed, and the first gap-fill metal-containing layer 318A and the second gap-fill metal-containing layer 318B may then be simultaneously formed, which respectively cover the third work function metal-containing layer 316A and the fourth work function metal-containing layer 316B.

To fabricate the integrated circuit device 100E shown in FIG. 8, processes which are similar to the processes described with reference to FIGS. 19A to 19C and the fabrication processes of the integrated circuit device 100D shown in FIG. 7 may be used. That is, without forming the first work function metal-containing layer 212A on the first gate insulating layer 144A in the gate space GS1, the third work function metal-containing layer 216A may be directly formed on the first gate insulating layer 144A.

In addition, the integrated circuit device 100E, which is shown in FIG. 9 and includes the isolation stack structure SL2 including the La-containing layer 222, may be fabricated by using processes, which are similar to the fabrication processes of the integrated circuit device 100E shown in FIG. 8 and the fabrication processes of the integrated circuit device 100B shown in FIG. 5.

To fabricate the integrated circuit device 100G shown in FIG. 10, reference may be made to the description of the fabrication method of the integrated circuit device 100C shown in FIG. 6. To fabricate the integrated circuit device 100H shown in FIG. 11, reference may be made to the description of the fabrication method of the integrated circuit device 100D shown in FIG. 7. To fabricate the integrated circuit devices 100G and 100H, the third work function metal-containing layer 316A and the fourth work function metal-containing layer 416B having a higher Al content than the third work function metal-containing layer 316A may be sequentially formed by separate processes. For example, each of the third work function metal-containing layer 316A and the fourth work function metal-containing layer 416B may be formed by an ALD or CVD process, and a flow rate of the Al source supplied in the process of forming fourth work function metal-containing layer 416B may be controlled to be greater than a flow rate of an Al source supplied in the process of forming the third work function metal-containing layer 316A. The third work function metal-containing layer 316A and the fourth work function metal-containing layer 416B having a higher Al content may be formed in any order.

To fabricate the integrated circuit device 100I shown in FIG. 12, an oxygen ion implantation process, which will be described below with reference to FIGS. 20A and 20B, may be used.

Figure 20A:
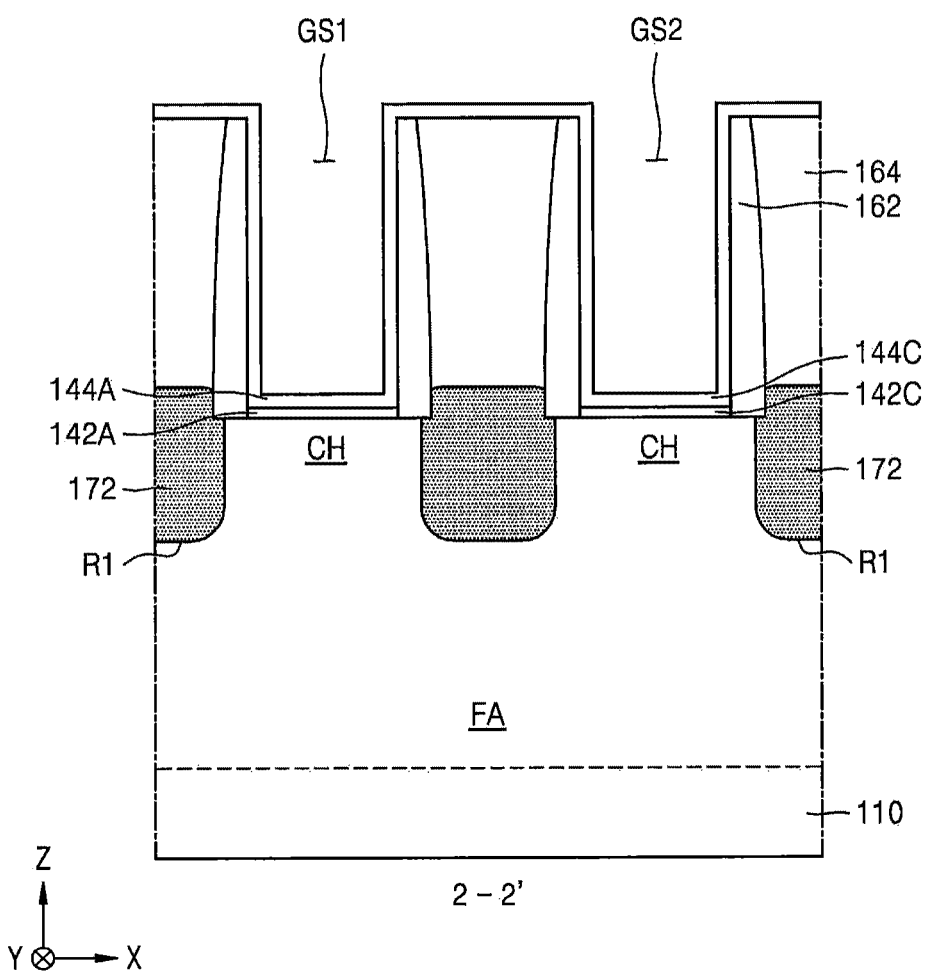
FIGS. 20A and 20B are cross-sectional views illustrating a method of fabricating an integrated circuit device, according to further embodiments of the inventive concepts.
Figure 20B:
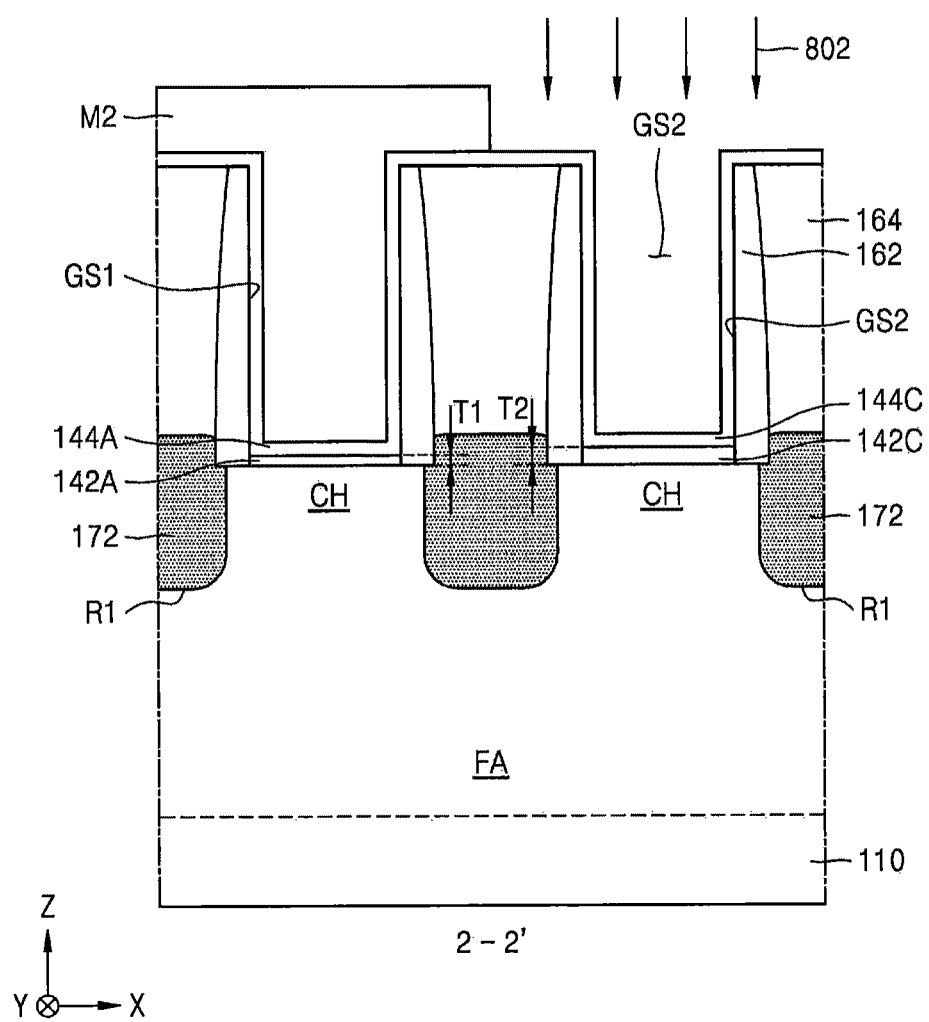

FIGS. 20A and 20B are schematic cross-sectional views illustrating sequential processes of a method of fabricating the integrated circuit device 100I shown in FIG. 12. In FIGS. 20A and 20B, the same reference numerals as in FIGS. 1 to 19C denote the same members, and descriptions thereof will be omitted.

Referring to FIG. 20A, in the same method as described with reference to FIGS. 17A and 17B, the gate spaces GS1 and GS2 are formed, followed by forming the first and third interfacial layers 142A and 142C and the first and third gate insulating layers 144A and 144C in the respective gate spaces GS1 and GS2.

Referring to FIG. 20B, while the gate space GS1 and the surrounding regions thereof are covered with a mask pattern M2, oxygen ions 802 are implanted into the gate space GS2 that is to be the fin isolation region FS.

In some embodiments, to implant the oxygen ions 802 into the gate space GS2, an annealing process may be performed while the third gate insulating layer 144C covering an inner wall of the gate space GS2 is exposed to an oxygen plasma atmosphere. The oxygen ions 802 implanted through the gate space GS2 may be diffused through the third gate insulating layer 144C and collected at an interface between the third gate insulating layer 144C and the third interfacial layer 142C. The oxygen ions 802 collected at this interface may contribute to oxidizing a portion of the third interfacial layer 142C by the annealing process, and the thickness of the third interfacial layer 142C may be increased by the oxidation. As a result, the thickness T2 of the third interfacial layer 142C may be greater than the thickness T1 of the first interfacial layer 142A.

Next, the mask pattern M2 is removed from the structure shown in FIG. 20B, and using a similar method to the method described with reference to FIGS. 19A to 19C, the first and second work function metal-containing layers 212A and 212B having different thicknesses, the third and fourth work function metal-containing layers 216A and 216B having the same thickness, and the first and second gap-fill metal-containing layers 218A and 218B are formed on the first and third gate insulating layers 144A and 144C in this stated order, thereby forming the gate stack structure GL1 and the isolation stack structure SL7 (see FIG. 12), which respectively fill the gate spaces GS1 and GS2.

To fabricate the integrated circuit device 100J shown in FIG. 13, a fluorine ion implantation process may be used.

Figure 21:
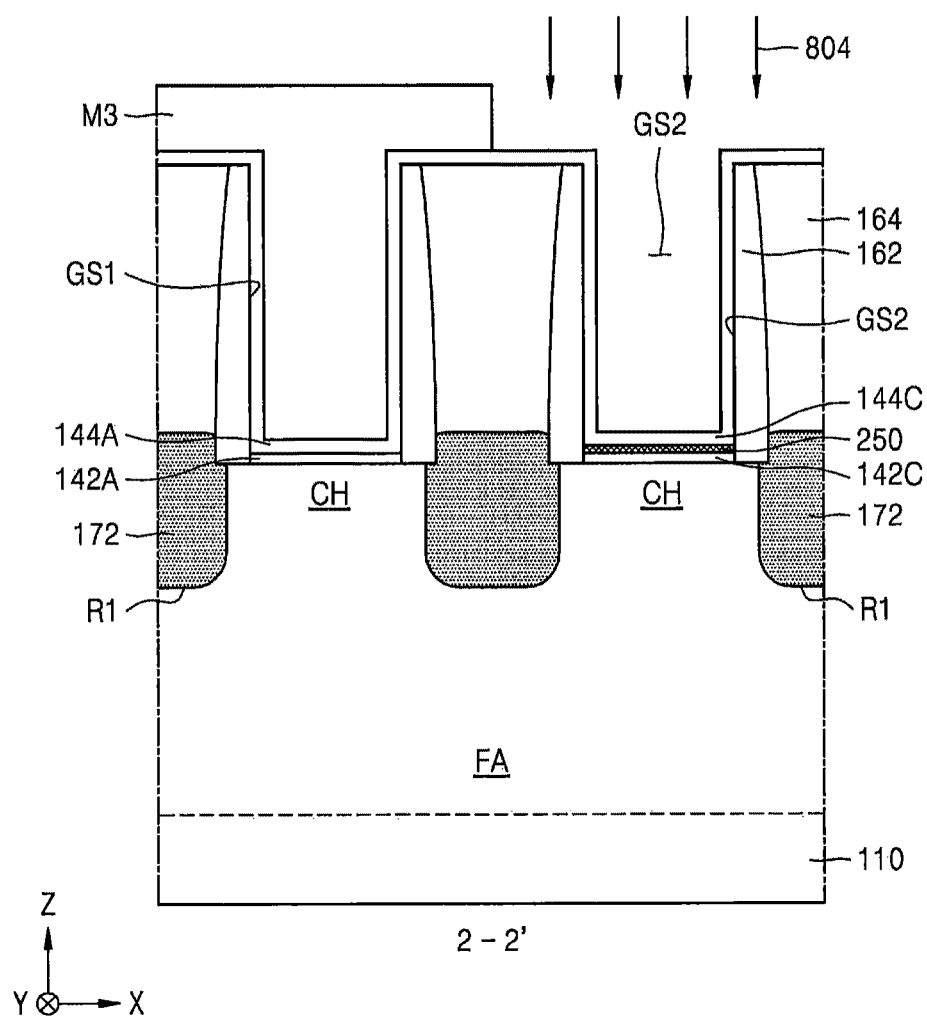
FIG. 21 is a cross-sectional view illustrating a method of fabricating an integrated circuit device, according to yet additional embodiments of the inventive concepts.

Referring to FIG. 21 for more details, similarly to the method described with reference to FIG. 20A, the first and third interfacial layers 142A and 142C and the first and third gate insulating layers 144A and 144C may be formed in the gate spaces GS1 and GS2, followed by implanting fluorine ions 804 into the gate space GS2 that is to be the fin isolation region FS, while the gate space GS1 and the surrounding regions thereof are covered with a mask pattern M3.

In some embodiments, to implant the fluorine ions 804 into the gate space GS2, plasma treatment or heat treatment may be performed while the third gate insulating layer 144C covering the inner wall of the gate space GS2 is exposed to a fluorine-containing gas atmosphere. The fluorine-containing gas may include, for example, $SF_6$.

The fluorine ions 804 implanted through the gate space GS2 may be diffused through the third gate insulating layer 144C and collected at the interface between the third gate insulating layer 144C and the third interfacial layer 142C, and as a result, the fluorine-containing layer 250 may be formed between the third gate insulating layer 144C and the third interfacial layer 142C.

Next, the mask pattern M3 is removed, and in a similar method to the method described with reference to FIGS. 19A to 19C, the first and second work function metal-containing layers 212A and 212B having different thicknesses, the third and fourth work function metal-containing layers 216A and 216B having the same thickness, and the first and second gap-fill metal-containing layers 218A and 218B are formed on the first and third gate insulating layers 144A and 144C in this stated order, thereby forming the gate stack structure GL1 and the isolation stack structure SL8 (see FIG. 13), which respectively fill the gate spaces GS1 and GS2.

In an example for fabricating the integrated circuit device 100K shown in FIG. 14, a silane ($SiH_4$) soaking process may be used.

Figure 22:
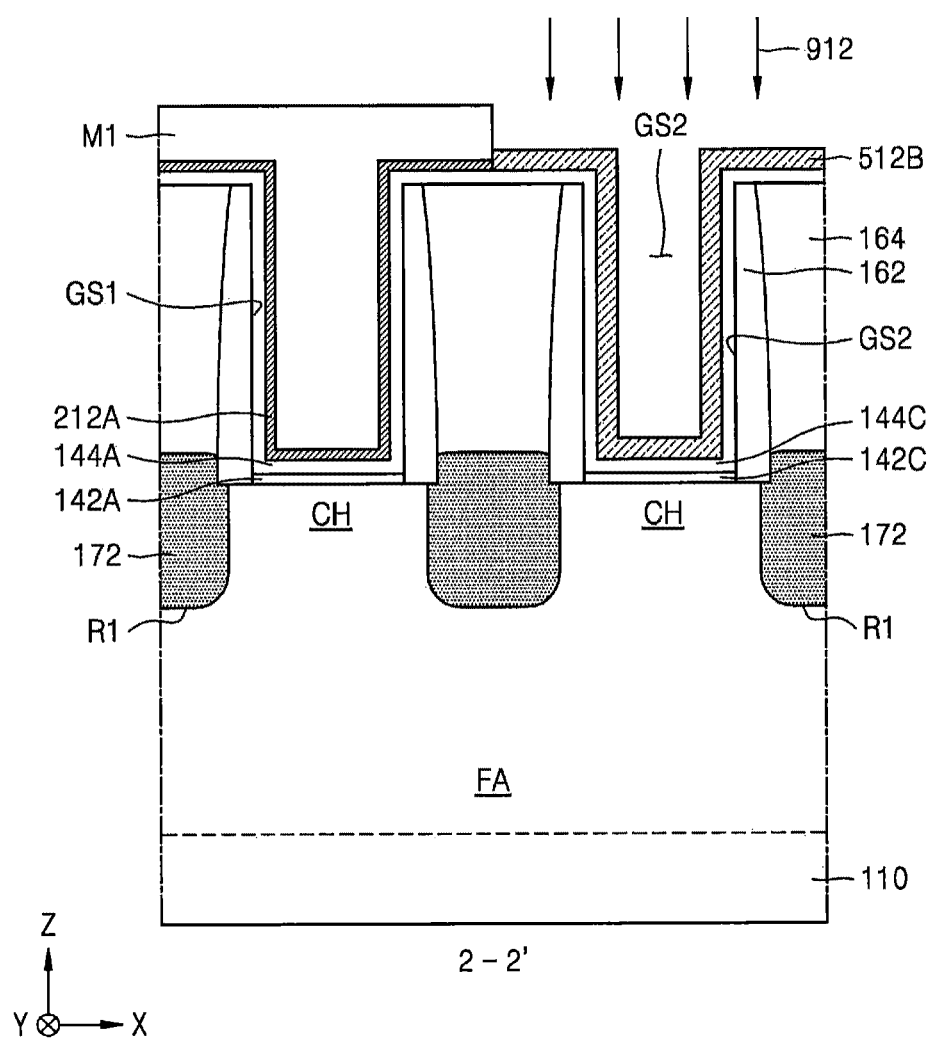
FIG. 22 is a cross-sectional view illustrating a method of fabricating an integrated circuit device according to still other embodiments of the inventive concepts.

Referring to FIG. 22 for more details, in the same method as described with reference to FIGS. 19A and 19B, the first and third interfacial layers 142A and 142C, the first and third gate insulating layers 144A and 144C, and the first and second work function metal-containing layers 212A and 212B are formed in the gate spaces GS1 and GS2. Then, the gate space GS1 and the first work function metal-containing layer 212A in the surrounding regions thereof are covered with the mask pattern M1, and the second work function metal-containing layer 212B in the gate space GS2, which is to be the fin isolation region FS, is exposed. The exposed second work function metal-containing layer 212B (see FIG. 19B) may be treated with silane 912. For the treatment with silane 912, silane 912 may be supplied to an exposed surface of the second work function metal-containing layer 212B at a flow rate of about 500 sccm to about 1000 sccm for about 10 seconds to about 1 minute.

As a result of the silane treatment, Si atoms are incorporated into the second work function metal-containing layer 212B to form the second work function metal-containing layer 512B doped with Si atoms from the second work function metal-containing layer 212B.

Next, the mask pattern M1 may be removed, and the third and fourth work function metal-containing layers 216A and 216B and the first and second gap-fill metal-containing layers 218A and 218B, which cover the second work function metal-containing layer 212B and the second work function metal-containing layer 512B in the respective gate spaces GS1 and GS2, may be formed in this stated order, thereby forming the gate stack structure GL1 and the isolation stack structure SL9 (see FIG. 14), which respectively fill the gate spaces GS1 and GS2.

Although the integrated circuit devices including FinFETs having 3-dimensional-structured channels and the fabrication methods thereof have been described with reference to FIGS. 1 to 22, integrated circuit devices including planar MOSFETs having the features according to the inventive concept may be provided by various modifications and changes of the inventive concept without departing from the spirit and scope of the inventive concept.

It will be understood that when an element such as a layer, region or substrate is referred to herein as being "on" another element, it can be directly on the other element or intervening elements may also be present. In contrast, when an element is referred to as being "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

Embodiments of the invention are described above with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

While the inventive concept has been particularly shown and described with reference to embodiments thereof, it will be understood that various changes in form and details may be made therein without departing from the spirit and scope of the following claims.

What is claimed is:

1. An integrated circuit device comprising:
an active region on a substrate;
a plurality of channel regions spaced apart from each other in the active region;
a plurality of source/drain regions on the substrate;
an insulating structure on the active region, the insulating structure defining a plurality of gate spaces;
a gate stack structure in a first gate space among the plurality of gate spaces, the gate stack structure comprising a first work function metal-containing layer; and
an isolation stack structure in a second gate space among the plurality of gate spaces that is adjacent the first gate space, the isolation stack structure having a different stack structure from the gate stack structure and being configured to electrically isolate a portion of the active region, wherein the isolation stack structure comprises a second work function metal-containing layer comprising a different material than the first work function metal-containing layer;
wherein the gate stack structure further comprises a first Al-containing layer having a first Al content, the first Al-containing layer comprising a different material than the first work function metal-containing layer and the second work function metal-containing layer, and
wherein the second work function metal-containing layer comprises a second Al-containing layer having a second Al content different from the first Al content.

2. The integrated circuit device according to claim 1, wherein the isolation stack structure does not include a layer comprising the same material as the first work function metal-containing layer.

3. The integrated circuit device according to claim 1, wherein the first work function metal-containing layer is a PMOS work function adjusting metal-containing layer comprising a metal nitride, and the second work function metal-containing layer is an NMOS work function adjusting metal-containing layer.

4. The integrated circuit device according to claim 1, wherein the first work function metal-containing layer is an NMOS work function adjusting metal-containing layer comprising Al atoms, and the second work function metal-containing layer is a PMOS work function adjusting metal-containing layer comprising a metal nitride.

5. The integrated circuit device according to claim 4, wherein the isolation stack structure further comprises a third work function metal-containing layer comprising a different material than the second work function metal-containing layer, and the third work function metal-containing layer comprises the same material as the first work function metal-containing layer.

6. The integrated circuit device according to claim 1, wherein the isolation stack structure further comprises a La-containing layer between the active region and the second work function metal-containing layer.

7. The integrated circuit device according to claim 6, wherein the gate stack structure does not include a layer comprising the same material as the La-containing layer.

8. The integrated circuit device according to claim 1, wherein the second Al content is greater than the first Al content.

9. The integrated circuit device according to claim 1, wherein the first work function metal-containing layer is substantially devoid of Si atoms, and the second work function metal-containing layer is doped with Si atoms.

10. An integrated circuit device comprising:
a substrate;
a fin-type active region extending in a first direction on the substrate;

a plurality of conductive stack structures on the fin-type active region that extend in parallel to each other along a second direction that intersects the first direction; and a plurality of source/drain regions on the fin-type active region, wherein the plurality of conductive stack structures includes:

a first gate stack structure having a first effective work function; and an isolation stack structure, which is adjacent the first gate stack structure, having a different stack structure from the first gate stack structure and having a second effective work function that is different from the first effective work function, wherein the isolation stack structure comprises a different material than the first gate stack structure;

wherein the first gate stack structure comprises a first work function metal-containing layer, and the isolation stack structure comprises a second work function metal-containing layer comprising a different material than the first work function metal-containing layer;

wherein the first gate stack structure further comprises an Al-containing layer having a first Al content, and wherein the second work function metal-containing layer comprises a second Al content greater than the first Al content.

11. The integrated circuit device according to claim 10, wherein the first gate stack structure further comprises a third work function metal-containing layer covering the first work function metal-containing layer, the third work function metal-containing layer comprising substantially the same material as a material comprised in the second work function metal-containing layer.

12. The integrated circuit device according to claim 10, wherein the isolation stack structure further comprises a fourth work function metal-containing layer covering the second work function metal-containing layer, the fourth work function metal-containing layer comprising substantially the same material as a material comprised in the first work function metal-containing layer.

13. The integrated circuit device according to claim 10, wherein the isolation stack structure further comprises a La-containing layer between the fin-type active region and the second work function metal-containing layer.

14. The integrated circuit device according to claim 10, wherein the plurality of conductive stack structures further includes a second gate stack structure having substantially the same structure as the first gate stack structure, wherein the second gate stack structure is adjacent the isolation stack structure and positioned opposite the first gate stack structure with the isolation stack structure interposed between the first gate stack structure and the second gate stack structure.

15. An integrated circuit device comprising:

an active region on a substrate;

a first channel region and a second channel region spaced apart from each other in the active region;

a first gate stack structure extending over the first channel region, the first gate stack structure comprising a first work function metal-containing layer;

a second gate stack structure extending over the second channel region, the second gate stack structure comprising the first work function metal containing layer; and an isolation stack structure positioned between the first gate stack structure and the second gate stack structure, the isolation stack structure comprising a second work function metal-containing layer comprising a different material than the first work function metal-containing layer, the isolation stack structure having a different effective work function than the first gate stack structure and the second gate stack structure, wherein the isolation stack structure is configured to function as an isolation region during normal operation of a first transistor that includes the first gate stack structure and a second transistor that includes second gate stack structure, wherein the first gate stack structure further comprises an Al-containing layer having a first Al content, and wherein the second work function metal-containing layer comprises a second Al content greater than the first Al content.

16. The integrated circuit device of claim 15, wherein each of the first gate stack structure and the second gate stack structure has a first stack structure and the isolation stack structure has a second stack structure that is different from the first stack structure, and wherein the isolation stack structure includes at least one of a La-containing layer and a metal layer doped with silicon, and each of the first gate stack structure and the second gate stack structure does not include the La-containing layer or the metal layer doped with silicon.

* * * * *